(12) United States Patent
Wu et al.

(10) Patent No.: US 12,709,012 B2
(45) Date of Patent: Aug. 18, 2026

(54) DEVICE ASSEMBLY SYSTEM AND METHOD

(71) Applicants: HUAWEI TECHNOLOGIES CO., LTD., Shenzhen (CN); Nanjing ENIGMA Automation Co., Ltd., Nanjing (CN)

(72) Inventors: Di Wu, Hangzhou (CN); Yuan Cheng, Nanjing (CN); Zhou Yu, Shenzhen (CN); Hongguang Liu, Hangzhou (CN); Jianrong Xu, Hangzhou (CN); JunShuang Gao, Nanjing (CN); Zhongtian Guo, Hangzhou (CN)

(73) Assignees: Huawei Technologies Co., Ltd., Shenzhen (CN); Nanjing ENIGMA Automation Co., Ltd., Nanjing (CN)

( * ) Notice: Subject to any disclaimer, the term of this patent is extended or adjusted under 35 U.S.C. 154(b) by 566 days.

(21) Appl. No.: 18/344,644

(22) Filed: Jun. 29, 2023

(65) Prior Publication Data

US 2023/0339705 A1 Oct. 26, 2023

Related U.S. Application Data

(63) Continuation of application No. PCT/CN2021/142182, filed on Dec. 28, 2021.

(30) Foreign Application Priority Data

Dec. 31, 2020 (CN) ......................... 202011624671.7

(51) Int. Cl.
*B25J 9/16* (2006.01)
*B23P 19/00* (2006.01)
(Continued)

(52) U.S. Cl.
CPC ............ *B25J 9/1687* (2013.01); *B23P 19/00* (2013.01); *B25J 5/00* (2013.01); *B25J 9/1602* (2013.01);
(Continued)

(58) Field of Classification Search
CPC . B25J 9/1687; B25J 5/00; B25J 9/1602; B25J 9/1669; B25J 9/1679; B25J 19/023;
(Continued)

(56) References Cited

U.S. PATENT DOCUMENTS 11,191,181 B1 * 11/2021 Tandon .................. B25J 9/1679
2007/0094535 A1 * 4/2007 Prasee .................. H05K 7/1498 714/5.11
(Continued)

FOREIGN PATENT DOCUMENTS

CN 105983976 A 10/2016
CN 107368067 A 11/2017
(Continued)

*Primary Examiner* — Thomas Randazzo
(74) *Attorney, Agent, or Firm* — Leydig, Voit & Mayer, Ltd.

(57) ABSTRACT

A device assembly system includes a control apparatus, a mobile apparatus, a lifting apparatus, and a plug in/out apparatus. The control apparatus is configured to control, based on an operation and maintenance instruction, the mobile apparatus, the lifting apparatus, and the plug in/out apparatus to complete an operation of the operation and maintenance instruction. The mobile apparatus is configured to move the device assembly system to a first location, and the first location identifies a rack in which a device is assembled. The lifting apparatus is configured to move the plug in/out apparatus to a target location in a first direction. The plug in/out apparatus is configured to place the device to be assembled at the target location, or obtain the device from the target location.

17 Claims, 13 Drawing Sheets

(51) Int. Cl.
*B25J 5/00* (2006.01)
*B25J 19/02* (2006.01)
*B65G 47/90* (2006.01)
*H05K 7/14* (2006.01)

(52) U.S. Cl.
CPC ........... *B25J 9/1669* (2013.01); *B25J 9/1679* (2013.01); *B25J 19/023* (2013.01); *H05K 7/1485* (2013.01); *B65G 47/905* (2013.01)

(58) Field of Classification Search
CPC ........ B25J 15/02; B23P 19/00; H05K 7/1485; B65G 47/905
See application file for complete search history.

(56) References Cited

U.S. PATENT DOCUMENTS

| | | | | |
|---|---|---|---|---|
| 2016/0107312 | A1* | 4/2016 | Morrill | G11B 17/22 700/214 |
| 2019/0104637 | A1* | 4/2019 | Jochim | H05K 7/1498 |
| 2020/0081439 | A1* | 3/2020 | Mukherjee | B25J 5/007 |

FOREIGN PATENT DOCUMENTS

| | | | | | |
|---|---|---|---|---|---|
| CN | 107985447 | A | | 5/2018 | |
| CN | 109795867 | A | * | 5/2019 | B65G 47/74 |
| CN | 209835510 | U | | 12/2019 | |
| CN | 111993383 | A | | 11/2020 | |
| CN | 109968322 | B | * | 5/2021 | B25J 9/1697 |
| DE | 202016105002 | U1 | * | 11/2016 | H05K 7/20745 |

* cited by examiner

DEVICE ASSEMBLY SYSTEM AND METHOD

CROSS-REFERENCE TO RELATED APPLICATIONS

This application is a continuation of International Application No. PCT/CN2021/142182, filed on Dec. 28, 2021, which claims priority to Chinese Patent Application No. 202011624671.7, filed on Dec. 31, 2020. The disclosures of the aforementioned applications are hereby incorporated by reference in their entireties.

STATEMENT OF JOINT RESEARCH AGREEMENT

The subject matter and the claimed invention were made by or on the behalf of Nanjing ENIGMA Automation Co., Ltd., of Nanjing, Jiangsu Province, P. R. China and Huawei Technologies Co., Ltd., of Shenzhen, Guangdong Province, P. R. China, under a joint research agreement titled “Ultimate Data Center Robot Technology Cooperation Project”. The joint research agreement was in effect on or before the claimed invention was made, and that the claimed invention was made as a result of activities undertaken within the scope of the joint research agreement.

TECHNICAL FIELD

This application relates to the field of data center technologies, and in particular, to a device assembly system and method.

BACKGROUND

A server is a key component of a data center, and server hardware maintenance is an important part of data center maintenance. Server hardware maintenance is mainly performed in the following scenarios: fault maintenance, component change and capacity expansion, and component recycling of an abandoned server. The server is deployed in a rack. Therefore, the server needs to be shelved or unshelved when the foregoing maintenance is performed. Currently, shelving or unshelving from the rack mainly depends on manual processing. For example, a process of shelving or unshelving the server is performed by manually operating an auxiliary device. However, as a server weight increases and a server density increases, a rack height increases. Consequently, shelving or unshelving from the rack becomes difficult. This is time-consuming and labor-consuming, and has a security risk.

SUMMARY

This application provides a device assembly system and method, to implement automatic shelving or unshelving of an apparatus in a rack in a data center, so as to improve maintenance efficiency and security of the data center, and reduce labor costs.

According to a first aspect, this application provides a device assembly system, including a control apparatus, a mobile apparatus, a lifting apparatus, and a plug in/out apparatus. The control apparatus is configured to control, based on an operation and maintenance instruction, the mobile apparatus, the lifting apparatus, and the plug in/out apparatus to complete an operation of the operation and maintenance instruction. Specifically, the operation and maintenance instruction instructs the device assembly system to complete an operation of assembly of a device. The mobile apparatus is configured to move the device assembly system to a first location under control of the control apparatus, and the first location identifies a rack in which the device is assembled. In other words, the mobile apparatus moves the device assembly system to a location near the rack to be operated, and the first location specifically means a location at which a to-be-plugged device in the rack can be operated. The lifting apparatus is configured to move the plug in/out apparatus to a target location in a first direction, the target location is a location for storing the device to be assembled in the rack, and may be specifically a slot of the rack, and the first direction is perpendicular to the ground. The plug in/out apparatus is configured to place the device to be assembled at the target location, or obtain the device from the target location. Specifically, the rack may include a plurality of slots, and each slot may accommodate a device to be assembled. The device may specifically be any type of device in the rack, for example, a computing device (for example, a server), a network device (for example, a switch), a storage device (for example, a storage array), and an energy device (for example, a battery or a power supply). In this solution, the device assembly system may be used to implement automatic assembly of the to-be-plugged device in the rack, and this may specifically mean shelving and unshelving of the to-be-plugged device in the rack. This not only reduces difficulty of a manual operation and improves efficiency, but also eliminates a security risk to an operator during the manual operation, and is especially applicable to a scenario in which the rack has a high-layer slot.

The mobile apparatus in the device assembly system may include a navigation device, so that the mobile apparatus can navigate to the first location under control of the control apparatus. The lifting apparatus is fastened to the mobile apparatus, the lifting apparatus has a plug in/out apparatus mounting frame for mounting the plug in/out apparatus, and the lifting apparatus drives the plug in/out apparatus mounting frame to move in the first direction, to drive the plug in/out apparatus move in the first direction, so that the plug in/out apparatus is opposite to the target location in the rack. The plug in/out apparatus includes a pose adjustment mechanism, a plug in/out mechanism, a first visual mechanism, and a first sensor. The pose adjustment mechanism is connected to the plug in/out mechanism, and drives the plug in/out mechanism to adjust a pose, so that the plug in/out mechanism is aligned with the target location in the rack, where the target location is a current slot. The first visual mechanism and/or the first sensor obtain pose information of the current slot, so that the control apparatus can control the pose adjustment mechanism to adjust the pose of the plug in/out mechanism, to enable the plug in/out mechanism to be aligned with the slot. The first visual mechanism is further configured to obtain a current slot number and a code of a current to-be-plugged device, so that the control apparatus can verify that the current slot is a slot to be assembled, and the current to-be-plugged device is a device to be assembled. The control apparatus is separately connected to the mobile apparatus, the lifting apparatus, and the plug in/out apparatus, and is configured to: control the mobile apparatus to move to the first location; control the lifting apparatus to drive the plug in/out apparatus to move to the target location in the first direction; and based on the pose information of the current slot and actual pose information of the plug in/out mechanism, control the pose adjustment mechanism to adjust the pose of the plug in/out mechanism, and control the plug in/out mechanism to plug the to-be-plugged device into the current slot, or control the plug in/out mechanism to plug the to-be-plugged device out of the current slot. In this way, automatic assembly of the to-be-plugged device in the rack is implemented.

In a specific technical solution, the mobile apparatus further includes a support leg mechanism, and the support leg mechanism is configured to support the device assembly system at the first location, so that the device assembly system is reliably and stably fastened to the first location, to prevent the device assembly system from moving at the first location. Specifically, the support leg mechanism includes a first drive assembly and a support leg, the first drive assembly is connected to the support leg, and drives the support leg to extend and retract in the first direction, and the support leg can extend towards the ground, to support the device assembly system. That is, in a movement process of the mobile apparatus, the support leg is extended into the inside of the mobile apparatus, and does not hinder movement of the mobile apparatus. However, when the mobile apparatus moves to the first location, the mobile apparatus needs to stop at the first location. In this case, the first drive assembly drives the support leg to extend out of the mobile apparatus, to support on the ground, so that the plug in/out apparatus is not likely to move when performing a plug in/out action.

In addition, the support leg mechanism may be further configured to level the device assembly system, that is, adjust a vertical angle of the device assembly system in the first direction, to adapt to a case in which the ground is not flat or the rack is vertically inclined, so that the device assembly system may be kept parallel to the rack, to improve assembly precision of the device assembly system. Specifically, the support leg mechanism includes at least four support legs and first drive assemblies connected to the support legs in a one-to-one correspondence, the at least four support legs form a surface support of the mobile apparatus, and each first drive assembly is connected to the control apparatus, this is, each support leg is driven separately. A length that is of each support leg and that extends out of the mobile apparatus may be adjusted based on an actual case, to level.

The lifting apparatus may further include a holding mechanism, and the holding mechanism is configured to connect the rack and the device assembly system. That is, when the device assembly system moves to the first location, the rack and the device assembly system are fixedly connected into a whole by using the holding mechanism, to prevent the rack or the device assembly system from falling down during device assembly. The holding mechanism may specifically include a fourth drive assembly and a holding hook, and the fourth drive assembly drives the holding hook to be fixedly connected to the rack.

In a specific technical solution, an end portion of the holding mechanism includes a first wall surface, a position sensor is disposed on the first wall surface, and is configured to: monitor a distance between the first wall surface and the rack, and send a reminder signal when the distance between the first wall surface and the rack is less than a specified value. The control apparatus is separately connected to the position sensor and the fourth drive assembly, and the control apparatus is configured to control, based on the reminder signal of the position sensor, the fourth drive assembly to drive the holding hook to be fixedly connected to the rack. In this way, the holding hook can be reliably fixedly connected to the rack.

When the plug in/out mechanism is specifically disposed, the plug in/out mechanism includes a to-be-plugged device accommodating frame, a ninth drive assembly, and at least one group of hook arms. The to-be-plugged device accommodating frame is configured to accommodate the to-be-plugged device. Each group of hook arms includes two hook arms disposed opposite to each other in a third direction, the two hook arms of each group of hook arms are located at two ends of the to-be-plugged device accommodating frame, to be convenient to connect to the to-be-plugged device from two sides of the to-be-plugged device, to move a location of the to-be-plugged device, for example, pull the to-be-plugged device out of the rack to the to-be-plugged device accommodating frame, or push the to-be-plugged device from the to-be-plugged device accommodating frame to the rack. Each hook arm has a hook adapted to the to-be-plugged device; the ninth drive assembly is connected to the control apparatus, and the control apparatus controls the ninth drive assembly to drive the hook arm to extend and retract in a second direction, to plug the to-be-plugged device located on the to-be-plugged device accommodating frame into the target location, or plug out the to-be-plugged device located at the target location to the to-be-plugged device accommodating frame. The first direction, the second direction, and the third direction are perpendicular to each other, and the three directions are equivalent to three directions of a three-dimensional rectangular coordinate system.

In a specific technical solution, the plug in/out mechanism includes n groups of hook arms, where $n \geq 2$, the n groups of hook arms are arranged in the first direction, at least $n-1$ groups of hook arms are connected to a tenth drive assembly, and the tenth drive assembly drives at least one group of hook arms in the at least $n-1$ groups of hook arms to extend and retract, to adapt to to-be-plugged devices with different thicknesses in the first direction. In other words, the at least $n-1$ groups of hook arms participate in an assembly operation or do not participate in an assembly operation, and this may be performed based on a structure of an actual to-be-plugged device. For example, for an assembly operation of the server, a same device assembly system may be adapted to servers of different specifications such as 1U, 2U, and 4U by selecting a quantity of extended-out hook arms.

Specifically, the tenth drive assembly includes a drive motor, a rotating shaft connected to the drive motor, and reset members connected to the at least $n-1$ groups of hook arms in a one-to-one correspondence. Cams that are in a one-to-one correspondence with the at least $n-1$ groups of hook arms are disposed on the rotating shaft, the cam drives the hook arm, to extend, and the reset member drives the hook arm to retract. In this solution, a structure of the tenth drive assembly is simple, and space occupied is small.

In another technical solution, the tenth driving assembly may include drive structures that are in a one-to-one correspondence with the at least $n-1$ groups of hook arms, and each drive structure is connected to the control apparatus, so that the control apparatus separately controls the at least $n-1$ groups of hook arms to extend or retract.

A roller may further be disposed at an end portion of the hook arm, and the roller can abut against the to-be-plugged device, to eliminate an abutting force between the to-be-plugged device and the rack, and facilitate locking of the to-be-plugged device and the rack.

In addition, a shutdown component may be disposed on an end surface of the hook arm, and may be specifically a protrusion structure. When the hook arm hooks the to-be-plugged device, the shutdown component can shut down the to-be-plugged device. This prevents problems such as device damage or data loss caused by forcible removal of the to-be-plugged device because the to-be-plugged device cannot be remotely shut down.

The mobile apparatus may further include an anti-collision strip circumferentially arranged, the mobile apparatus further includes a navigation component, and the anti-collision strip is connected to the navigation component. A second sensor is inside the anti-collision strip. When the anti-collision strip collides with an obstacle, the second sensor may trigger a signal, and the navigation component controls, based on the signal of the anti-collision strip, the mobile apparatus to change a direction or stop moving. In this way, the mobile apparatus can be prevented from colliding with a fragmentary component on the ground, and the like. This is mainly for a small component located on the ground and difficult to be found by the navigation component, and may improve reliability of a movement process of the mobile apparatus.

When the lifting apparatus is specifically disposed, the lifting apparatus may include a second drive assembly, a first gantry, a second gantry, and a third gantry, the first gantry is fastened to the mobile apparatus, and a plug in/out apparatus mounting frame is mounted on the third gantry. The first gantry is connected to the second gantry through a straight-line transmission member, and the second drive assembly is connected to the straight-line transmission member, to drive the second gantry to move in the first direction relative to the first gantry. The first gantry is connected to the third gantry through a rope mechanism, the rope mechanism includes a chain and a pulley, two ends of the chain are respectively connected to the third gantry and the first gantry, the pulley is mounted on the second gantry, and the second gantry is located between the first gantry and the third gantry. In this way, when the second drive assembly drives the second gantry to move in the first direction relative to the first gantry, the second drive assembly can also drive the third gantry to move in the first direction, to improve a transmission ratio of the lifting apparatus. In addition, the gantry is used as the lifting apparatus, and a structure of the gantry has good stability, and is not likely to fall down.

To improve flexibility of the plug in/out apparatus in the first direction, a third drive assembly may be disposed between the plug in/out apparatus mounting frame and the third gantry, and the third drive assembly drives the plug in/out apparatus mounting frame to move in the first direction relative to the third gantry. In other words, the lifting apparatus may implement multi-layer lifting for the plug in/out apparatus.

When the pose adjustment mechanism is specifically disposed, the pose adjustment mechanism includes a first portion, a second portion, a third portion, a fourth portion, and a fifth portion that are disposed in sequence, the first portion is fastened to the plug in/out apparatus mounting frame, a fifth drive assembly is connected between the first portion and the second portion, and the fifth drive assembly drives the second portion to rotate relative to the first portion by using the first direction as an axis. A sixth drive assembly is connected between the second portion and the third portion, and the sixth drive assembly drives the third portion to move relative to the second portion in a second direction. One end of the third portion is hinged to one end of the fourth portion, a hinged shaft of the third portion and the fourth portion extends in the second direction, the other end of the third portion and the other end of the fourth portion are connected to a seventh drive assembly, and the seventh drive assembly drives the fourth portion to swing relative to the third portion. An eighth drive assembly is connected between the fifth portion and the fourth portion, and the eighth drive assembly drives the fifth portion, to move in a third direction relative to the fourth portion. The fifth drive assembly, the sixth drive assembly, the seventh drive assembly, and the eighth drive assembly are separately connected to the control apparatus, and the first direction, the second direction, and the third direction are perpendicular to each other. In this solution, the pose adjustment structure may adjust a location of the plug in/out apparatus in any direction in the three-dimensional coordinate system, so that the pose of the plug in/out apparatus is aligned with a pose at the target location with high precision.

According to a second aspect, this application provides a device assembly method. The method includes the following steps.

A control apparatus receives an operation and maintenance instruction, and the operation and maintenance instruction includes an operation type, a rack number, a slot number, and a code of a to-be-plugged device;

- the control apparatus controls, based on the operation and maintenance instruction, a mobile apparatus to move to a first location, and the first location identifies a rack in which the device is assembled;
- the control apparatus controls a first visual mechanism to scan, to obtain a current rack number, and verifies whether the current rack number is consistent with the rack number in the operation and maintenance instruction;
- the control apparatus controls the lifting apparatus to drive a plug in/out apparatus to move to a target location in a first direction after verifying that the current rack number is consistent with the rack number in the operation and maintenance instruction, the target location is a slot for storing the device in the rack, and the first direction is perpendicular to the ground;
- the control apparatus controls the first visual mechanism to scan, to obtain a current slot number and a code of a current to-be-plugged device, and verifies whether the current slot number and the code of the current to-be-plugged device are consistent with the slot number and the code of the to-be-plugged device in the operation and maintenance instruction;
- after verifying that the current slot number and the code of the current to-be-plugged device are consistent with the slot number and the code of the to-be-plugged device in the operation and maintenance instruction, the control apparatus obtains pose information of the current slot and current pose information of the plug in/out mechanism, and controls, based on the pose information of the current slot and the current pose information of the plug in/out mechanism, a pose adjustment mechanism of the plug in/out apparatus to adjust a pose of the plug in/out mechanism, to enable a hook arm of the plug in/out mechanism to be aligned with the slot; and
- the control apparatus controls the hook arm to extend, to plug the to-be-plugged device into the slot, or plug the to-be-plugged device out of the slot.

In this solution, a device assembly system may be used to implement automatic assembly of the to-be-plugged device in the rack, and this may specifically mean shelving and unshelving of the to-be-plugged device in the rack. This not only reduces difficulty of a manual operation and improves efficiency, but also eliminates a security risk to an operator during the manual operation, and is especially applicable to a scenario in which the rack has a high-layer slot.

After the mobile apparatus moves to the first location, the control apparatus may further control at least four support legs of a support leg mechanism to extend, and level the mobile apparatus. In this solution, the support leg mechanism is used to support the device assembly system, so that stability of the device assembly system can be improved, and the support mechanism can be used to level the mobile apparatus. That the mobile apparatus is leveled may mean that the device assembly system is parallel to the rack, or may mean that the mobile apparatus is in a horizontal state, that is, an extension direction that is of the device assembly system and that is away from the mobile apparatus is perpendicular to the ground. This improves alignment precision between the plug in/out apparatus and the slot.

In addition, after the lifting apparatus drives the plug in/out apparatus to move to the target location in the first direction, the control apparatus may further control a holding hook of a holding mechanism to be fixedly connected to the rack bearing the to-be-plugged device. This solution can make the device assembly system and the rack form an integral structure, to prevent the device assembly system or the rack from falling down in a working process of the device assembly system.

DETAILED DESCRIPTION

As computing power and density of a server increase, a server weight increases accordingly. During operation and maintenance management of a data center, it is time-consuming and labor-consuming to manually shelve or unshelve the server. In particular, a server located at a high location may have a security risk of falling down. A device provided in this application can effectively resolve the foregoing problems, and avoid problems of high implementation difficulty, low efficiency, poor security, and high costs of data center operation and maintenance caused by a manual operation. This application provides a device assembly system, configured to implement automatic assembly of a to-be-assembled device in the data center. Specifically, this includes performing a shelving operation and an unshelving operation on the to-be-assembled device. The to-be-assembled device may be any type of device in a rack, for example, a computing device (for example, a server), a network device (for example, a switch), a storage device (for example, a storage array), and an energy device (for example, a battery or a power supply). The rack in this application is any cabinet that can hold the device. Shelving is a specified operation to place the to-be-assembled device in the rack. Unshelving is to plug the to-be-assembled device at a specified location in the rack out of the rack.

For ease of description, the following embodiments and accompanying drawings of this application are mainly described by using an example in which a to-be-plugged device is the server, the server is assembled in the rack, and an automatic shelving operation and unshelving operation are implemented. In addition, when a device actually assembled by the device assembly system is not the server, adaptation design may be performed on details of a specific structure that is of each apparatus of the system and that depends on the to-be-plugged device, for example, details of a structure of a to-be-plugged device accommodating frame for bearing the to-be-plugged device, and details of a structure of a hook arm.

Figure 1:
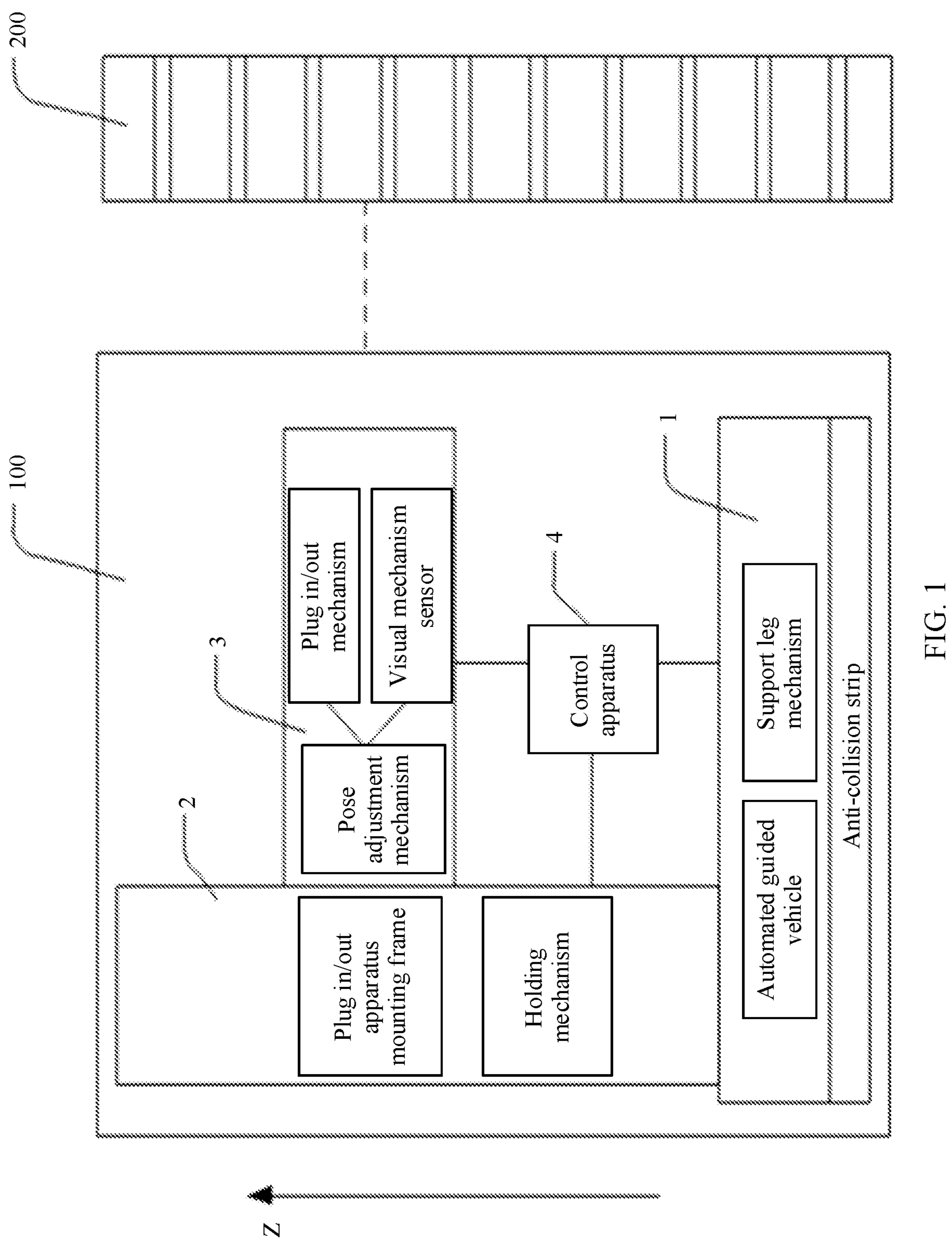
FIG. 1 is a schematic block diagram of a device assembly system according to an embodiment of this application.
Figure 2:
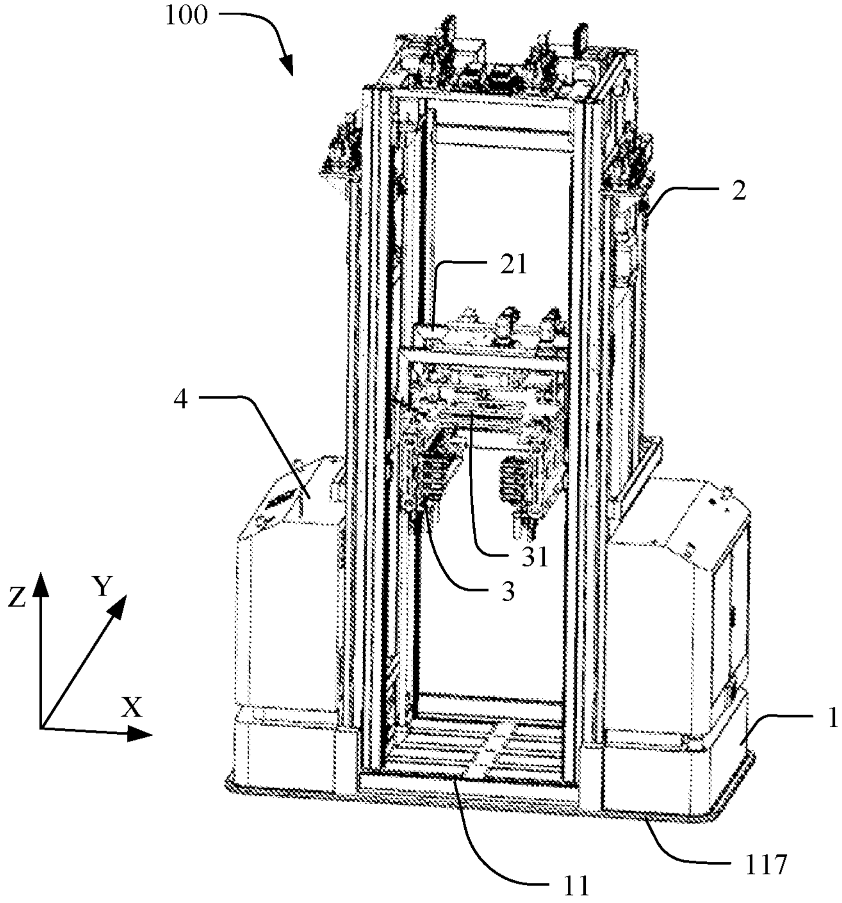
FIG. 2 is a schematic diagram of a structure of a device assembly system according to an embodiment of this application.

FIG. 1 is a schematic block diagram of a device assembly system according to an embodiment of this application. FIG. 2 is a schematic diagram of a structure of a device assembly system according to an embodiment of this application. As shown in FIG. 1 and FIG. 2, a device assembly system 100 includes a mobile apparatus 1, a lifting apparatus 2, a plug in/out apparatus 3, and a control apparatus 4. The control apparatus 4 is separately connected to the mobile apparatus 1, the lifting apparatus 2, and the plug in/out apparatus 3, and is configured to control the mobile apparatus 1, the lifting apparatus 2, and the plug in/out apparatus 3, to act automatically. Specifically, acting automatically includes: the mobile apparatus 1 automatically moves to a first location, the lifting apparatus 2 automatically lifts the plug in/out apparatus to a target location, and the plug in/out apparatus 3 automatically plugs a to-be-plugged device into the target location or plugs the to-be-plugged device out of the target location. The mobile apparatus 1 is configured to move the device assembly system to the first location, and specifically includes a navigation device (for example, an automated guided vehicle 11 (AGV)). Under control of the control apparatus 4, with reference to a navigation mechanism of the automated guided vehicle 11, the mobile apparatus 1 may move to the first location, to perform a plug in/out operation on the to-be-plugged device of this station. The lifting apparatus 2 is configured to move the plug in/out apparatus to the target location in a first direction, and the target location is a location for storing a device in a rack, and may be specifically a slot. The lifting apparatus 2 is specifically mounted on the mobile apparatus 1, and is connected to a plug in/out apparatus mounting frame 21. The plug in/out apparatus 3 is configured to place the device at the target location, or obtain the device from the target location, and the plug in/out apparatus 3 is specifically mounted on the plug in/out apparatus mounting frame 21. The lifting apparatus 2 may drive the plug in/out apparatus mounting frame 21 to move in a first direction Z, that is, the lifting apparatus 2 may drive the plug in/out apparatus 3 to rise or fall in the first direction Z, and the first direction Z is perpendicular to the ground. The control apparatus 4 controls the lifting apparatus 2 to drive the plug in/out apparatus 3 to rise or fall to a specified location, and the specified location may be specifically a location that is of the plug in/out mechanism 32 and that is relative to a slot in which the to-be-plugged device is located. Therefore, the plug in/out apparatus 3 is opposite to the slot in which the to-be-plugged device is located in the first direction Z, to facilitate a subsequent plug in/out action. In this solution, the device assembly system 100 may be used to implement shelving or unshelving of the to-be-plugged device in a rack 200. This not only reduces difficulty of a manual operation and improves efficiency, but also eliminates a security risk to an operator during the manual operation, and is especially applicable to a scenario in which the rack 200 has a high-layer slot.

The plug in/out apparatus 3 specifically includes a pose adjustment mechanism 31, a plug in/out mechanism 32, a first visual mechanism 33, and a first sensor 34. The plug in/out mechanism 32 implements a specific plug in/out action of the to-be-plugged device. The pose adjustment mechanism 31 is connected to the plug in/out mechanism 32, and is configured to adjust a specific pose of the plug in/out mechanism 32 in each dimension in a three-dimensional coordinate system, so that the plug in/out mechanism 32 can have precise alignment precision. Specifically, precision more precise than millimeter-level alignment precision can be implemented, so that accuracy of the plug in/out operation is improved. In addition, an unnecessary collision may be reduced, which may cause damage to the to-be-plugged device. Specifically, the first visual mechanism 33 and/or the first sensor 34 may obtain pose information of a current slot, and the control apparatus 4 obtains the pose information of the current slot, and controls the pose adjustment mechanism 31 based on the pose information of the current slot and pose information of the plug in/out mechanism 32, to adjust a pose of the plug in/out mechanism 32, so that the plug in/out mechanism 32 is opposite to the slot of the rack 200 with high precision. The control apparatus 4 is further configured to control the plug in/out mechanism 32 to plug in/plug out the to-be-plugged device, to implement automatic shelving or unshelving of the apparatus in the rack. The first visual mechanism 33 may be further configured to: obtain a current slot number and a code of a current to-be-plugged device, and compare the current slot number and the code of the current to-be-plugged device with a number of a slot on which shelving or unshelving needs to be performed and a code of a to-be-plugged device on which shelving or unshelving needs to be performed. A next step of the plug in/out operation is performed only when the current slot number matches the number of the slot on which shelving or unshelving needs to be performed and the code of the current to-be-plugged device matches the code of the to-be-plugged device on which shelving or unshelving needs to be performed. Otherwise, the plug in/out operation is stopped and an alarm signal is generated. This is to prevent incorrect shelving or unshelving. In conclusion, the control apparatus 4 may cooperate with the first visual mechanism 33 and the first sensor 34, and therefore, the device assembly system 100 in this embodiment of this application can implement automatic shelving or unshelving of the apparatus in the rack, so as to replace the manual operation. This has high efficiency, good stability, and high security.

Figure 3:
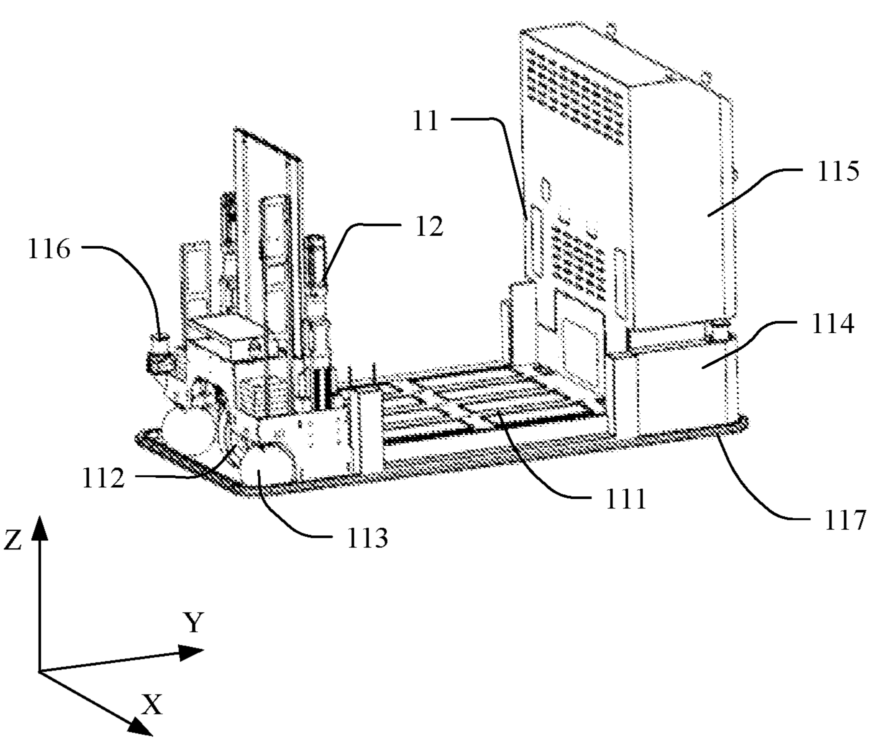
FIG. 3 is a schematic diagram of a structure of a mobile apparatus according to an embodiment of this application.

For ease of understanding the device assembly system 100 in this application, the following sequentially describes a possible structure of each part with reference to accompanying drawings and embodiments. FIG. 3 is a schematic diagram of a structure of a mobile apparatus according to an embodiment of this application. As shown in FIG. 3, the mobile apparatus 1 includes the automated guided vehicle 11, and the automated guided vehicle 11 includes a base 111, a steering wheel 112, a universal wheel 113, a drive structure 114, and a navigation component 115. The navigation component 115 is connected to the control apparatus 4, and can navigate the automated guided vehicle 11 to the first location based on an instruction of the control apparatus 4. In a specific embodiment, the navigation component 115 may include laser SLAM (Simultaneous Localization And Mapping, synchronous positioning and map construction), that is, a laser radar 116 is disposed in the mobile apparatus 1, and the laser radar 116 is used to implement navigation and obstacle avoidance of the automated guided vehicle 11, and a reaction is sensitive. In addition, the automated guided vehicle 11 may further include a second visual mechanism and/or a second sensor. The control apparatus 4 is connected to the second visual mechanism and the second sensor, and may control the mobile apparatus 1, to avoid an obstacle or stop in an emergency based on a signal of the second visual mechanism and the second sensor. In addition, after the mobile apparatus 1 reaches a location near the first location, a location of the mobile apparatus 1 may be finely adjusted, to improve accuracy that the mobile apparatus 1 reaches the first location. Specifically, the second visual mechanism, the second sensor, and the like may detect an obstacle in a moving path of the mobile apparatus 1 and a small component such as a memory module left on the ground, to avoid component damage caused by rolling and damage to the apparatus and the ground. For example, an anti-collision strip 117 is disposed circumferentially around the mobile apparatus 1, the anti-collision strip 117 is elastic, and the second sensor is inside the anti-collision strip 117. When the anti-collision strip 117 touches an obstacle, a signal is triggered, and the control apparatus 4 receives the signal of the anti-collision strip 117, and controls, based on the signal of the anti-collision strip 117, the mobile apparatus 1 to change a direction or stop moving. In addition to performing navigation by using the laser SLAM, the navigation component 115 may further perform navigation by using a magnetic strip and a two-dimensional code. This is not limited in this application.

In a specific movement process of the mobile apparatus 1, the navigation component 115 controls, based on the instruction of the control apparatus 4, the drive structure 114 to drive the steering wheel 112 to rotate, so as to drive the automated guided vehicle 11 to move. In this embodiment, the mobile apparatus 1 includes two steering wheels 112, and the steering wheels 112 are respectively located in a front direction and a rear direction of the mobile apparatus 1. The universal wheel 113 is disposed on the circumferential side of the mobile apparatus 1, to improve flexibility and stability of the mobile apparatus 1 in the movement process.

Figure 4:
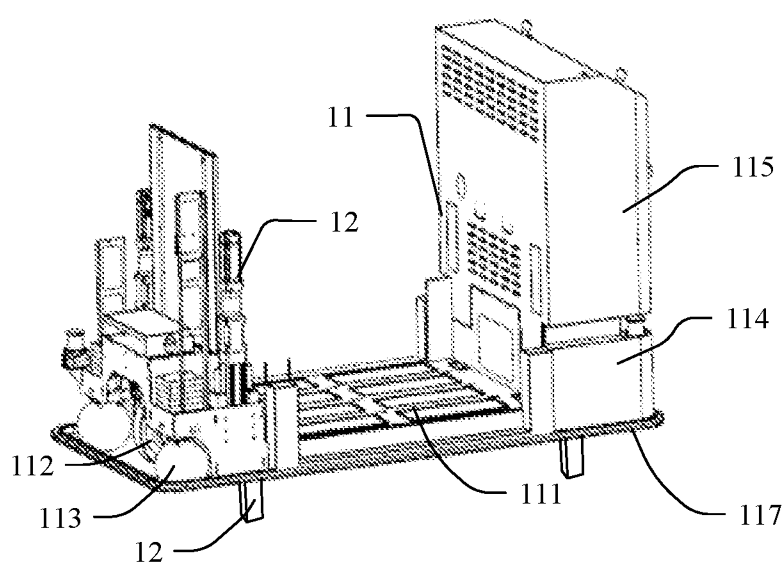
FIG. 4 is a schematic diagram of another structure of a mobile apparatus according to an embodiment of this application.

FIG. 4 is a schematic diagram of another structure of a mobile apparatus according to an embodiment of this application. With reference to FIG. 3 and FIG. 4, the mobile apparatus 1 may further include a support leg mechanism 12, configured to support the device assembly system at the first location. The support leg mechanism 12 includes a first drive assembly and a support leg, and specifically includes a plurality of support legs. The plurality of support legs are connected to the first drive assembly, and the first drive assembly can drive the support legs to extend and retract in the first direction Z. When the mobile apparatus 1 is in a moving state, as shown in FIG. 3, the support leg is in a shrinking state. When the mobile apparatus 1 moves to the first location, the mobile apparatus 1 needs to stop and be fastened to the first location. The first drive assembly drives the support leg to extend from the base 111, to support on the ground, as shown in FIG. 4, so as to support the entire device assembly system 100. Specifically, the first drive assembly may include a motor or an electric actuator, to drive the support leg to extend or retract. In this solution, when the device assembly system 100 reaches the first location, and an apparatus in the rack 200 needs to be shelved or unshelved, the first drive assembly drives the support leg to extend out of the base 111, to support on the ground. Compared with using the steering wheel 112 and the universal wheel 113 as support structures, using the support legs as the support structures has good stability, and is not likely to move. This helps improve security and alignment precision of the device assembly system 100.

In addition, to improve a supporting effect of the mobile apparatus 1, the support leg mechanism 12 includes at least four support legs. When the four support legs are included, the four support legs may be arranged in a square manner at four corners of the base 111. Certainly, another arrangement manner may also be used, provided that a stable support structure can be formed. The support mechanism may further include more support legs, to improve support stability. The foregoing support leg assembly may be further configured to adjust a vertical angle of the device assembly system in the first direction. The support leg may have a one-to-one correspondence with the first drive assembly, and the first drive assembly is connected to the control apparatus 4. Specifically, the control apparatus 4 may control a length of a part that is of the support leg driven by each first drive assembly and that extends out of the base 111, so that the length of the part that is of the support leg and that extends out of the base 111 may be adjusted, to adapt to a problem that the ground is not flat or the rack 200 is not vertically mounted. That the rack 200 is not vertically mounted means that an extension direction of the rack is not perpendicular to the ground, that is, a vertical angle of the rack in the first direction is not zero. In this solution, the device assembly system 100 may be kept parallel to the rack 200, or the device assembly system 100 may be kept at a specified angle. This solution can improve a success rate and reliability of plugging in/plugging out the to-be-plugged device in the device assembly system 100, and improve universality of the device assembly system 100.

Figure 5:
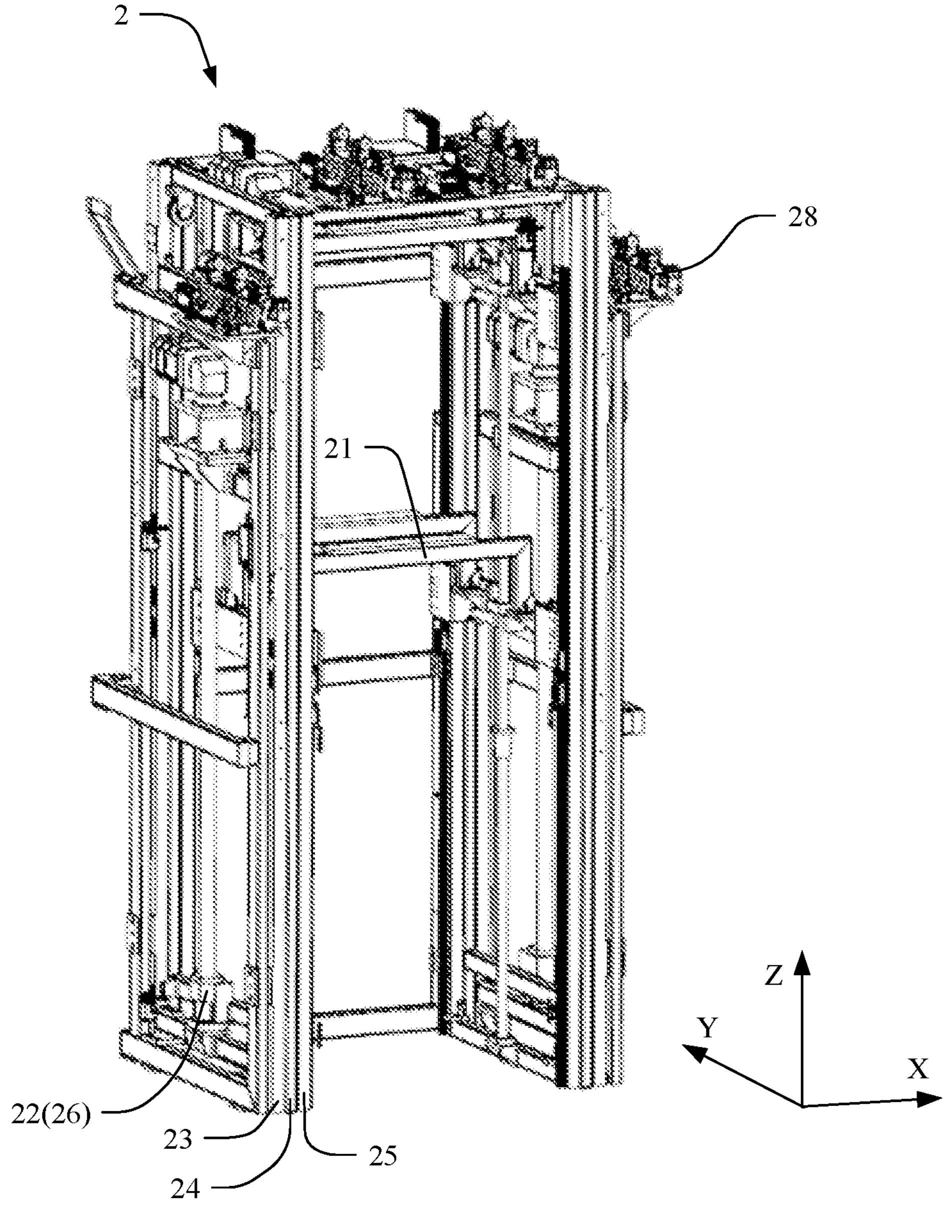
FIG. 5 is a schematic diagram of a structure of a lifting apparatus according to an embodiment of this application.
Figure 6:
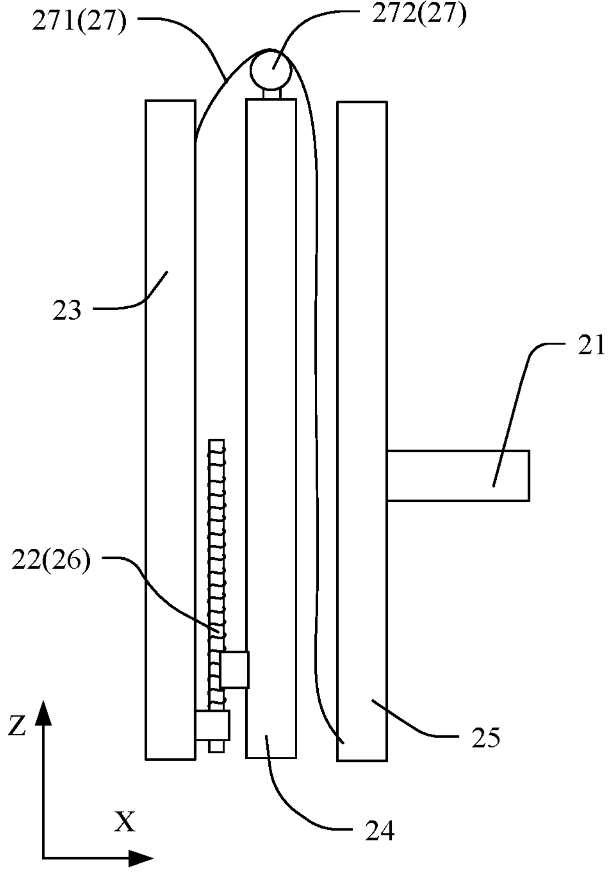
FIG. 6 is a schematic diagram of a partial structure of a lifting apparatus according to an embodiment of this application.
Figure 7:
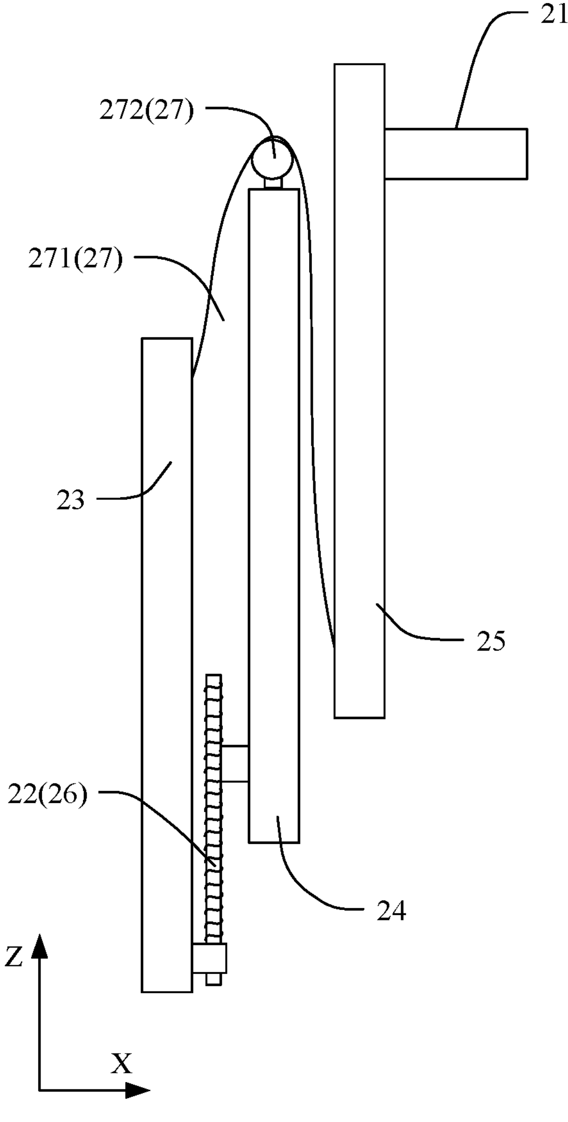
FIG. 7 is a schematic diagram of another partial structure of a lifting apparatus according to an embodiment of this application.

FIG. 5 is a schematic diagram of a structure of a lifting apparatus according to an embodiment of this application. FIG. 6 is a schematic diagram of a partial structure of a lifting apparatus according to an embodiment of this application. FIG. 7 is a schematic diagram of another partial structure of a lifting apparatus according to an embodiment of this application. With reference to FIG. 2, FIG. 5, FIG. 6, and FIG. 7, the lifting apparatus 2 is mounted on the mobile apparatus 1, and may specifically include a second drive assembly 22, a first gantry 23, a second gantry 24, and a third gantry 25. The first gantry 23 is fastened to the mobile apparatus 1, and the plug in/out apparatus mounting frame 21 is disposed on the third gantry 25. The second drive assembly 22 may include a straight-line transmission member 26. The straight-line transmission member 26 is located between the first gantry 23 and the second gantry 24. For example, the straight-line transmission member 26 may be a screw assembly, a sliding block and slide rail cooperation assembly, or the like. Therefore, the second gantry 24 is driven to move in the first direction Z relative to the first gantry 23. The second gantry 24 is disposed between the first gantry 23 and the third gantry 25, and the first gantry 23 and the third gantry 25 are connected through a rope structure 27. As shown in FIG. 6, in an embodiment, as shown in FIG. 6 and FIG. 7, the rope structure 27 includes a chain 271 and a pulley 272. Two ends of the chain 271 are respectively connected to the second gantry 24 and the first gantry 23. The pulley 272 is located on the second gantry 24. When the second drive assembly 22 drives the second gantry 24 to move in the first direction Z relative to the first gantry 23, the third gantry 25 also moves in the first direction Z under an action of the rope structure 27. As shown in FIG. 7, the third gantry 25 drives the plug in/out apparatus mounting frame 21 to rise. This structure is used, the second drive assembly 22 is connected to the control apparatus 4, and the control apparatus 4 may control the second drive assembly 22 to drive the third gantry 25 to move a specified distance in the first direction Z, so that the plug in/out apparatus 3 disposed on the plug in/out apparatus mounting frame 21 is at an equal height with the slot, to facilitate a subsequent plug in/out operation. In this solution, a movement distance actually driven by the second drive assembly 22 may be doubled through the rope structure 27, so that a movement stroke between adjacent gantries is reduced, and overall stability of the structure is improved.

The plug in/out apparatus mounting frame 21 may be fastened to the third gantry 25, or may be movably mounted on the third gantry 25 by using a third drive assembly. The third drive assembly may drive the plug in/out apparatus mounting frame 21 to move in the first direction Z relative to the third gantry 25. In this solution, after a location of the third gantry 25 is fixed, the third drive assembly may drive the plug in/out apparatus mounting frame 21 to move in the first direction Z relative to the third gantry 25, to improve flexibility and accuracy of the plug in/out apparatus 3 in the first direction Z.

The solution in which the lifting apparatus 2 uses three-stage gantries is merely used as a possible implementation. In a specific implementation, this is not limited, provided that the lifting apparatus 2 can implement that the plug in/out apparatus mounting frame 21 moves in the first direction Z.

Figure 8:
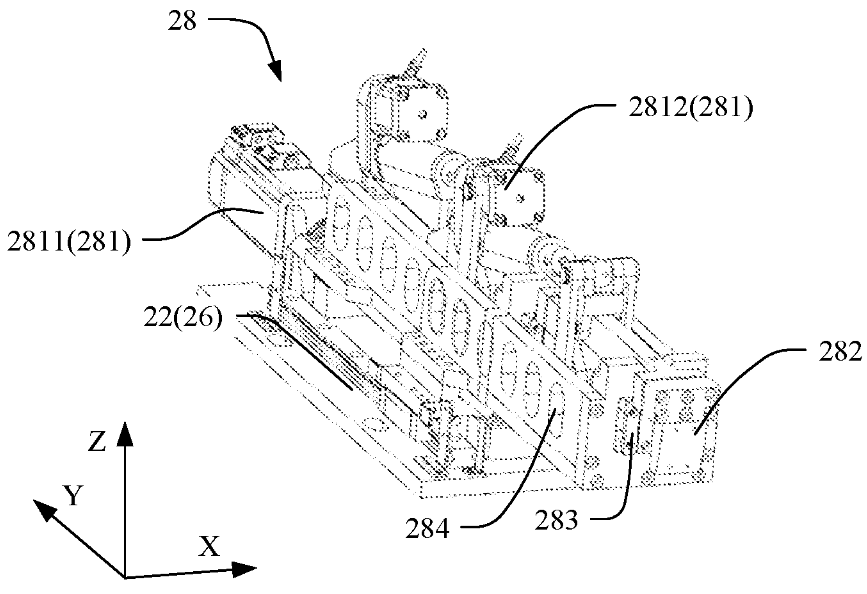
FIG. 8 is a schematic diagram of a structure of a holding mechanism according to an embodiment of this application.

As shown in FIG. 5, the lifting apparatus 2 further includes a holding mechanism 28, configured to connect the rack and the device assembly system, so that the rack and the device assembly system form an integral force system. FIG. 8 is a schematic diagram of a structure of a holding mechanism according to an embodiment of this application. As shown in FIG. 8, the holding mechanism 28 includes a fourth drive assembly 281 and a holding hook 282. After the mobile apparatus 1 drives the device assembly system 100 to move to the first location, the fourth drive assembly 281 is configured to drive the holding hook 282 to be fixedly connected to the rack 200 bearing the to-be-plugged device, so that the device assembly system 100 and the rack 200 are fastened as an integral structure. An external pushing force generated by the plug in/out action is converted into an internal driving force in the system, so that a probability that the rack 200 and the device assembly system 100 fall down can be reduced, impact of a plug in/out impact force on the device assembly system 100 is reduced. This improves stability and reliability of a working process of the device assembly system 100.

Figure 9:
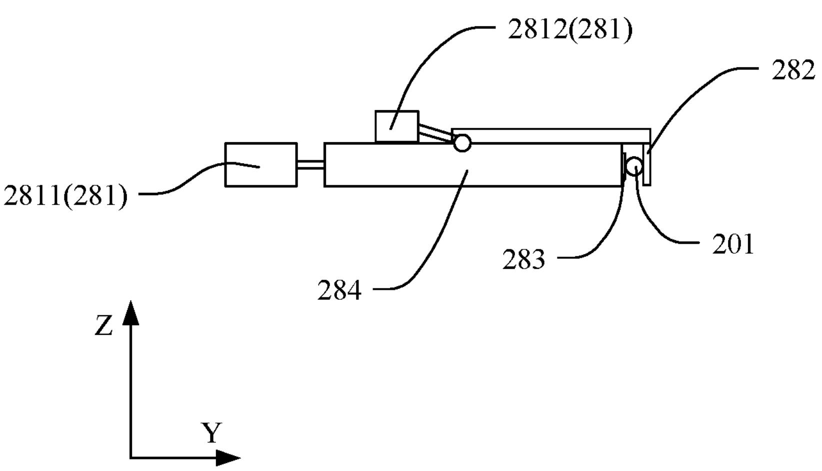
FIG. 9 is a schematic diagram of another structure of a holding mechanism according to an embodiment of this application.

FIG. 9 is a schematic diagram of another structure of a holding mechanism according to an embodiment of this application. As shown in FIG. 8 and FIG. 9, in a specific embodiment, an end portion of the holding mechanism 28 includes a first wall surface 283, and a position sensor is disposed on the first wall surface 283. The position sensor and the fourth drive assembly 281 are separately connected to the control apparatus 4. The control apparatus 4 controls the holding mechanism 28 to move towards the rack 200, and the position sensor triggers a signal when monitoring the rack 200. The control apparatus 4 controls, based on the signal of the position sensor, the fourth drive assembly 281 to drive the holding hook 282 to be fixedly connected to the rack 200, so that the device assembly system 100 and the rack 200 are fastened as an integral structure. In this way, falling down is not likely to occur.

As shown in FIG. 8 and FIG. 9, in a specific embodiment, the fourth drive assembly 281 includes a protruding motor 2811 and a holding motor 2812, the holding mechanism 28 includes a protruding portion 284 and the holding hook 282, the holding hook 282 is hinged to the protruding portion 284, the protruding motor 2811 drives the protruding portion 284 to extend and retract, and the holding motor 2812 drives the holding hook 282 to swing. The first wall surface 283 is located at the protruding portion 284. When the holding mechanism 28 needs to be fixedly connected to the rack 200, the protruding motor 2811 drives the protruding portion 284 to move towards the rack 200. When the first wall surface 283 extends to a specified location of the rack 200, for example, the rack 200 has a fixed rod 201, and the protruding portion 284 is opposite to the fixed rod 201, when the first wall surface 283 and the fixed rod 201 are spaced by a specified distance, the position sensor triggers the signal. The control apparatus 4 controls, based on the signal, the holding motor 2812 to drive the holding hook 282 to swing, so that a hook of the holding hook 282 and the first wall surface 283 form a clamping structure and clamp the fixed rod 201. In this way, the holding mechanism 28 is fastened to the fixed rod 201.

Figure 10:
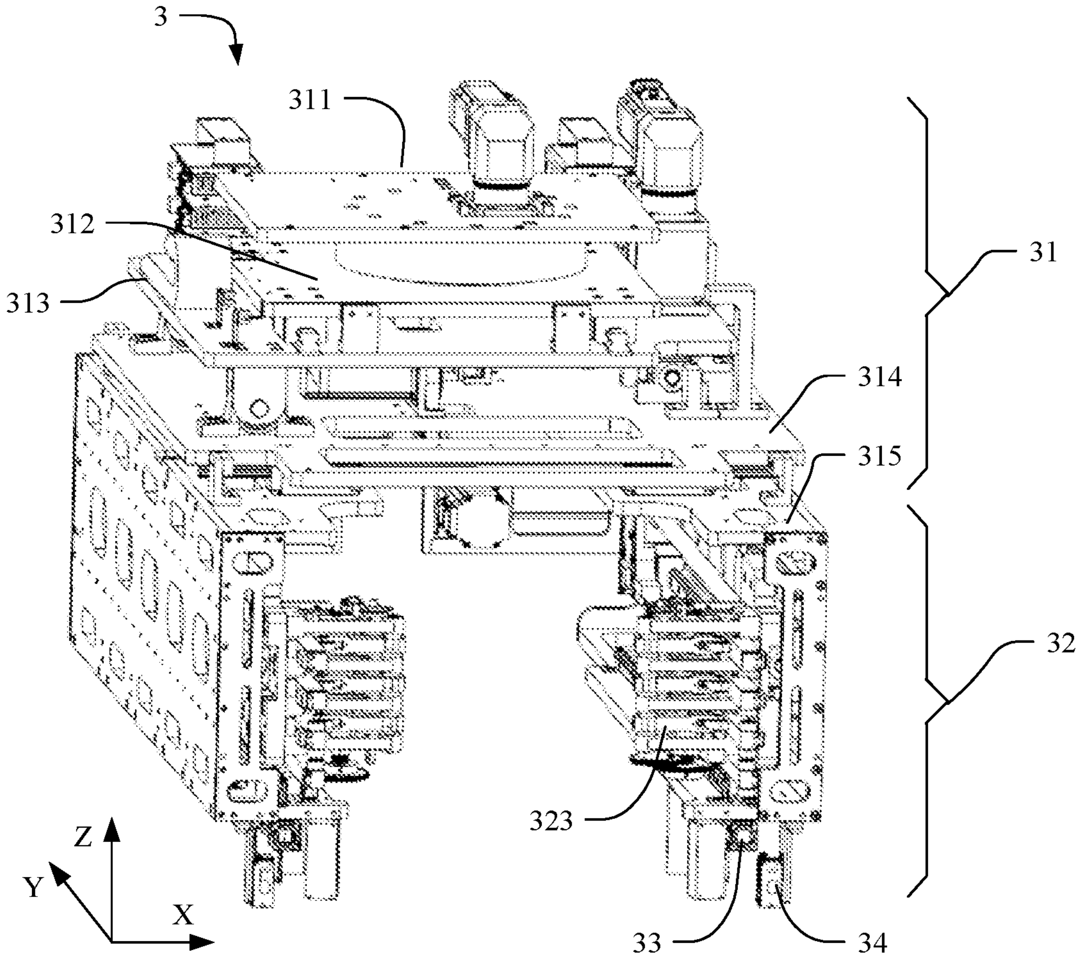
FIG. 10 is a schematic diagram of a structure of a plug in/out apparatus according to an embodiment of this application.

FIG. 10 is a schematic diagram of a structure of a plug in/out apparatus according to an embodiment of this application. With reference to FIG. 2 and FIG. 10, the plug in/out apparatus 3 includes a pose adjustment mechanism 31, a plug in/out mechanism 32, a first visual mechanism 33, and a first sensor 34. The pose adjustment mechanism 31 is configured to adjust the pose of the plug in/out mechanism 32 in a plurality of dimensions in the three-dimensional coordinate system. The plug in/out mechanism 32 is configured to grip a to-be-plugged device, and drive the to-be-plugged device to be plugged in a slot or plugged out of the slot. The pose adjustment mechanism 31 is mounted on the plug in/out apparatus mounting frame 21 of the lifting apparatus 2, the plug in/out mechanism 32 is mounted on the pose adjustment mechanism 31, and the first visual mechanism 33 and the first sensor 34 are mounted on the plug in/out mechanism 32. The control apparatus 4 is separately connected to the first visual mechanism 33, the first sensor 34, and the pose adjustment mechanism 31. The first visual mechanism 33 and the first sensor 34 are configured to obtain a current location of the plug in/out mechanism 32 and a target location of the to-be-plugged device or the slot. The control apparatus 4 may calculate a deviation between the current location of the plug in/out mechanism 32 and the target location based on information of the first visual mechanism 33 and the first sensor 34, and control the pose adjustment mechanism 31 to adjust the pose of the plug in/out mechanism 32 in the plurality of dimensions in the three-dimensional coordinate system, so that the location of the plug in/out mechanism 32 is opposite to the to-be-plugged device or the slot, to improve accuracy of an action of the plug in/out apparatus 3, and reduce a case such as structural damage caused by an alignment deviation.

In a specific embodiment, each of FIG. 11 to FIG. 14 is a schematic diagram of a partial structure of a pose adjustment mechanism according to an embodiment of this application. As shown in FIG. 10 to FIG. 14, the pose adjustment mechanism 31 includes a first portion 311, a second portion 312, a third portion 313, a fourth portion 314, and a fifth portion 315 that are disposed in sequence. The first portion 311 is fastened to the plug in/out apparatus mounting frame 21, and the plug in/out mechanism 32 is mounted on the fifth portion 315. A fifth drive assembly 316 is connected between the first portion 311 and the second portion 312. The fifth drive assembly 316 drives the second portion 312 to rotate relative to the first portion by using the first direction Z as an axis, to adjust a rotation angle of the plug in/out apparatus 3, so that the plug in/out mechanism 32 is aligned with the target location in a rotation direction that rotation is performed by using the first direction Z as the axis. A sixth drive assembly 317 is connected between the second portion 312 and the third portion 313. The sixth drive assembly 317 drives the third portion 313 to move relative to the second portion 312 in a second direction Y, to adjust an adjustment location of the plug in/out mechanism 32 in the second direction Y, so that the plug in/out mechanism 32 is aligned with the target location in the second direction Y. The third portion 313 includes a first end and a second end, the fourth portion 314 includes a third end and a fourth end, the first end of the third portion 313 is hinged to the third end of the fourth portion 314, and a hinged shaft extends in the second direction Y. A seventh drive assembly 318 is connected between the second end of the third portion 313 and the fourth end of the fourth portion 314. The seventh drive assembly 318 drives the fourth portion 314 to swing relative to the third portion 313, to adjust a horizontal tilt angle of the plug in/out mechanism 32, so that the plug in/out mechanism 32 is parallel to the target location in a horizontal direction. An eighth drive assembly 319 is connected between the fifth portion 315 and the fourth portion 314. The eighth drive assembly 319 drives the fifth portion 315 to move relative to the fourth portion 314 in a third direction X, to adjust a location of the plug in/out mechanism 32 in the third direction X, so that the plug in/out mechanism 32 is aligned with the target location in the third direction X. Specifically, the fifth drive assembly 316, the sixth drive assembly 317, the seventh drive assembly 318, and the eighth drive assembly 319 are separately connected to the control apparatus 4, and the control apparatus 4 controls the fifth drive assembly 316, the sixth drive assembly 317, the seventh drive assembly 318, and the eighth drive assembly 319 based on a signal of the first visual mechanism 33 and the first sensor 34, to adjust the location of the plug in/out mechanism 32 in various directions and angles, so as to improve alignment precision between the plug in/out mechanism 32 and the target location, and improve working reliability of the plug in/out apparatus 3. Specifically, the first direction Z, the second direction Y, and the third direction X are perpendicular to each other.

In a specific embodiment, the fifth drive assembly 316, the sixth drive assembly 317, the seventh drive assembly 318, and the eighth drive assembly 319 may be disposed in different sequences. For example, the sixth drive assembly 317 may be disposed between the first portion 311 and the second portion 312, to adjust a location of the second portion 312 relative to the first portion 311 in the second direction Y. In conclusion, the pose adjustment mechanism 31 may implement location adjustment in various directions, locations of drive assemblies in various directions may be adjusted based on an actual requirement.

Figure 11:
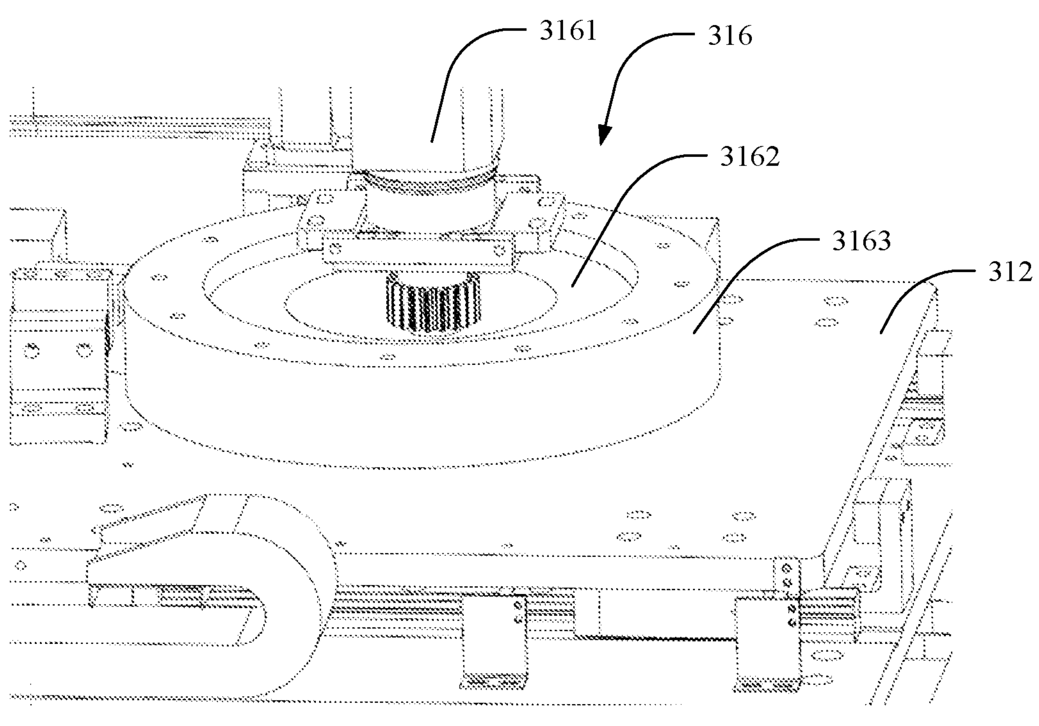
FIG. 11 is a schematic diagram of a partial structure of a pose adjustment mechanism according to an embodiment of this application.
Figure 12:
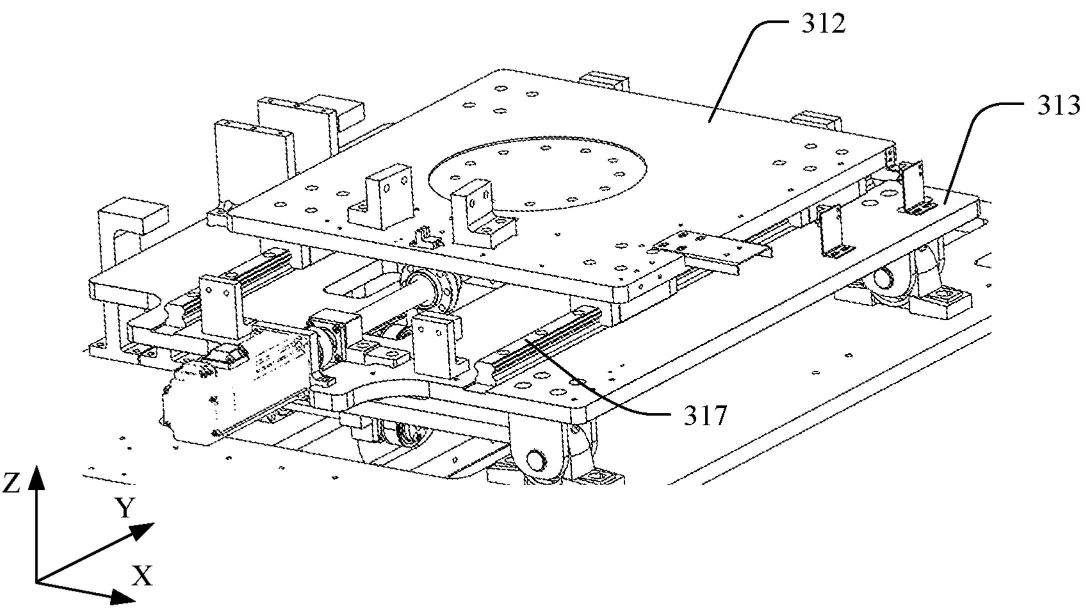
FIG. 12 is a schematic diagram of another partial structure of a pose adjustment mechanism according to an embodiment of this application.
Figure 13:
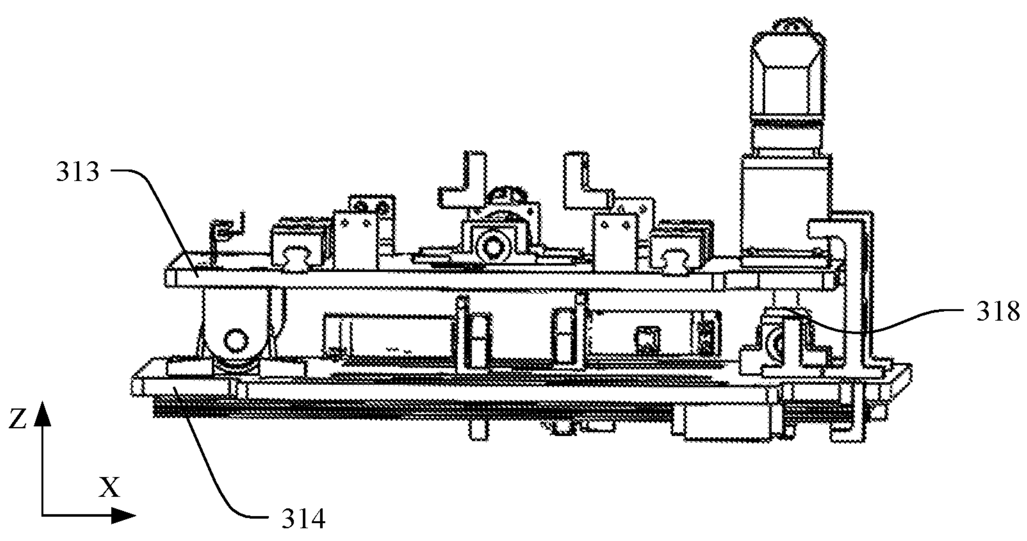
FIG. 13 is a schematic diagram of another partial structure of a pose adjustment mechanism according to an embodiment of this application.
Figure 14:
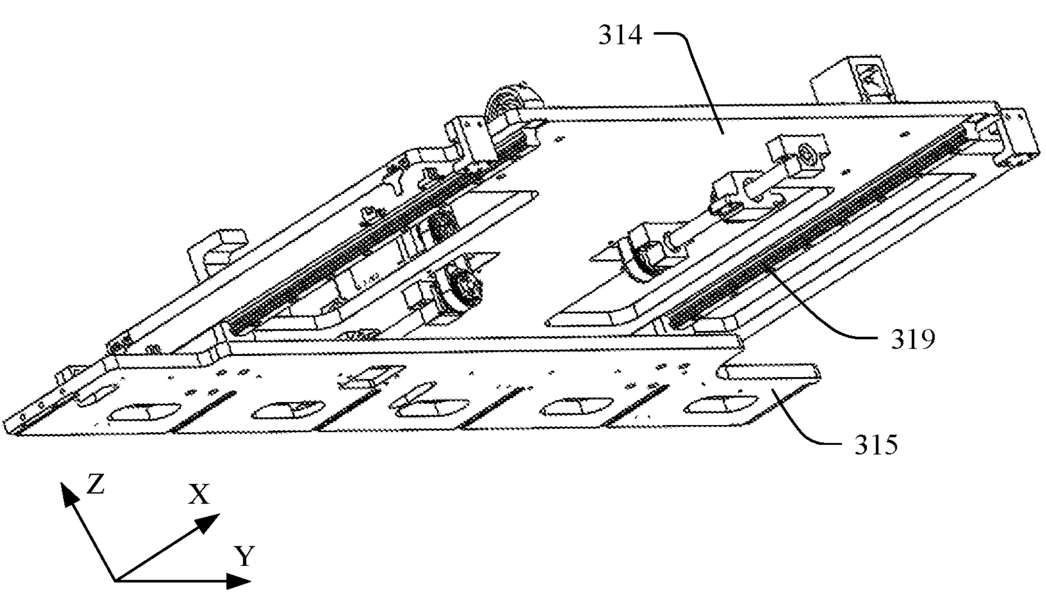
FIG. 14 is a schematic diagram of another partial structure of a pose adjustment mechanism according to an embodiment of this application.

In a specific embodiment, as shown in FIG. 11, the fifth drive assembly 316 may include a motor 3161, a rotating support inner shaft 3162, and a rotating support outer shaft 3163. The rotating support inner shaft 3162 is fixedly connected to the second portion 312, the rotating support outer shaft 3163 is fixedly connected to the first portion 311, and the rotating support inner shaft 3162 is rotatably connected to the rotating support outer shaft 3163, for example, a roll ball is disposed between the rotating support inner shaft 3162 and the rotating support outer shaft 3163. As shown in FIG. 12 to FIG. 14, the sixth drive assembly 317, the seventh drive assembly 318, and the eighth drive assembly 319 each are a straight-line drive assembly, for example, include a sliding block and slide rail assembly, a cylinder assembly, and a screw assembly. This is not limited in this application. In addition, the fifth drive assembly 316, the sixth drive assembly 317, the seventh drive assembly 318, and the eighth drive assembly 319 may further include a limiting structure such as a limiting block or a photoelectric sensor, to prevent a structure of a part or another component from being damaged due to excessive movement of the part.

Figure 15:
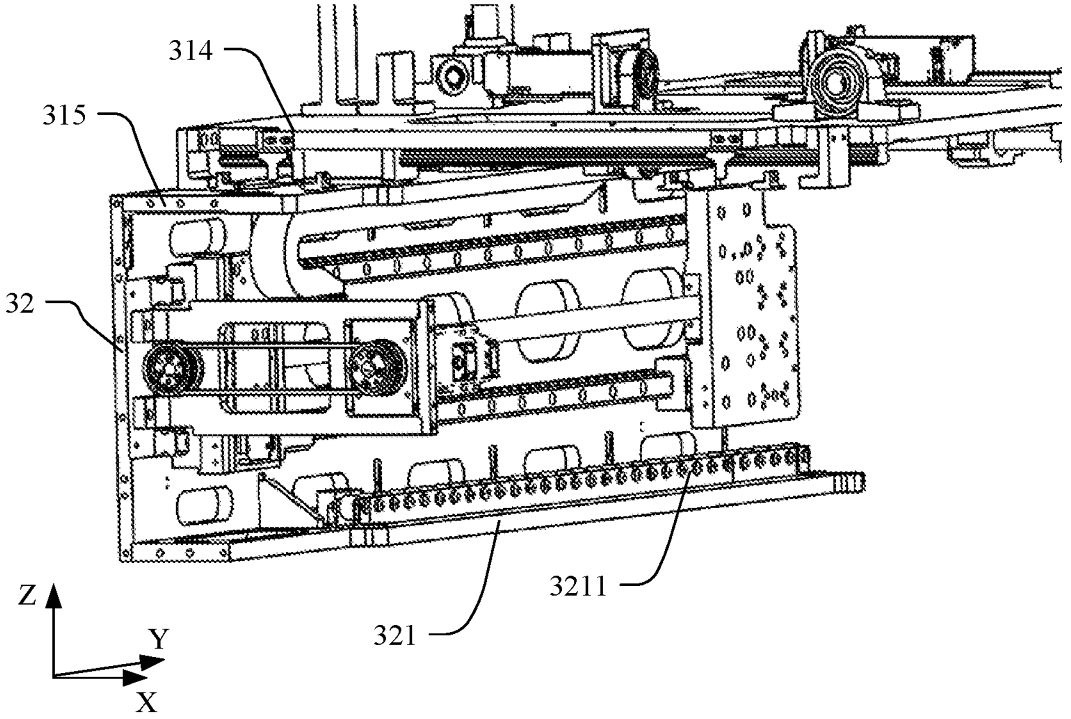
FIG. 15 is a schematic diagram of a partial structure of a plug in/out mechanism according to an embodiment of this application.

FIG. 15 is a schematic diagram of a partial structure of a plug in/out mechanism according to an embodiment of this application. With reference to FIG. 10 and FIG. 15, the plug in/out mechanism 32 includes a to-be-plugged device accommodating frame 321, a ninth drive assembly 322, and at least one group of hook arms 323. The to-be-plugged device accommodating frame 321 is configured to: bear and accommodate the to-be-plugged device. Each group of hook arms 323 includes two hook arms 323 that are disposed opposite to each other. The two hook arms 323 are arranged at two ends of the to-be-plugged device accommodating frame 321 in the third direction X, so that each group of hook arms 323 can be connected to the to-be-plugged device from two sides of the to-be-plugged device, to move the location of the to-be-plugged device, and plug the to-be-plugged device located on the to-be-plugged device accommodating frame into the target location, or plug out the to-be-plugged device located at the target location to the to-be-plugged device accommodating frame. The ninth drive assembly 322 is connected to the control apparatus 4, and the control apparatus 4 controls the ninth drive assembly 322 to drive the hook arm 323 to extend and retract in the second direction Y. The hook arm 323 has a hook 3231 that adapts to the to-be-plugged device, so that the hook 3231 of the hook arm 323 may be clamped with the to-be-plugged device, to pull the to-be-plugged device. A server is used as an example, the hook 3231 of the hook arm 323 adapts to a pull hook of the server, so that the server located in the rack 200 may be pulled to the to-be-plugged device accommodating frame 321 and moves to a specified location. Alternatively, a server on the to-be-plugged device accommodating frame 321 may be pushed into the slot of the rack 200.

As shown in FIG. 15, the to-be-plugged device accommodating frame 321 includes a roller chain 3211, so that when the to-be-plugged device moves on the to-be-plugged device mounting frame 21, friction of the to-be-plugged device can be reduced. This is convenient to use the hook arm 323 to push and pull the to-be-plugged device on the to-be-plugged device accommodating frame 321, and can reduce damage to the to-be-plugged device.

Figure 16:
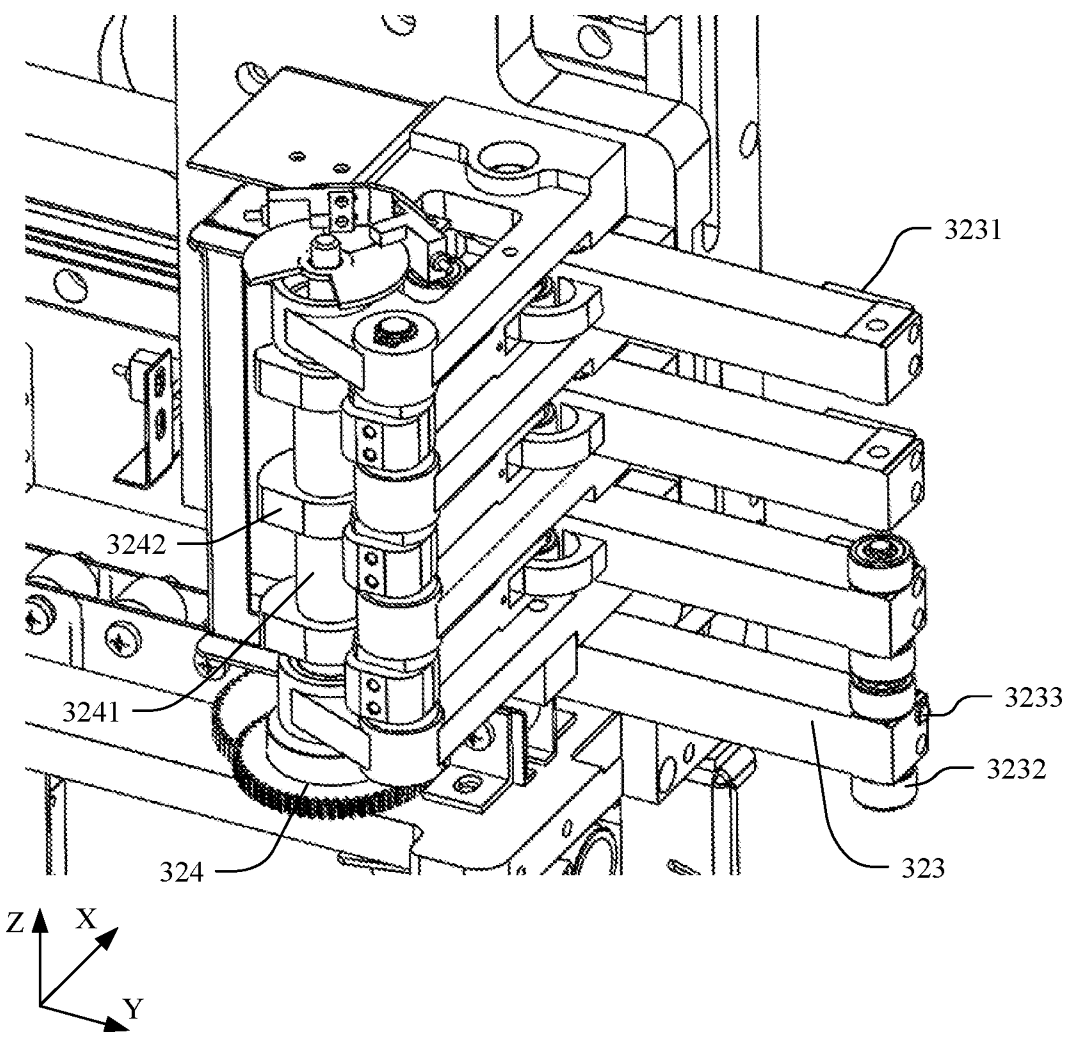
FIG. 16 is a schematic diagram of another partial structure of a plug in/out mechanism according to an embodiment of this application.

FIG. 16 is a schematic diagram of another partial structure of a plug in/out mechanism according to an embodiment of this application. With reference to FIG. 10 and FIG. 16, in a specific embodiment, the plug in/out mechanism 32 includes n groups of hook arms 323, where $n \geq 2$. The n groups of hook arms 323 are arranged in the first direction Z, to adapt to to-be-plugged devices of different specifications and sizes. For example, if the to-be-plugged device is the server, the device assembly system 100 in this application may adapt to servers of different U slots, for example, 1 U, 2 U, and 4 U servers of different specifications, where U is a unit indicating an external dimension of a server, and 1 U=44.45 mm. At least n−1 groups of hook arms 323 of the n groups of hook arms 323 are connected to a tenth drive assembly 324, and the tenth drive assembly 324 is connected to the control apparatus 4. The control apparatus 4 may control the tenth drive assembly 324 to drive the at least one group of hook arms 323 in the at least n−1 groups of hook arms 323 to extend and retract. In this solution, a corresponding hook arm 323 may be selected to extend based on a size and a specification of the to-be-plugged device, to improve compatibility of the device assembly system 100 in this application. For example, in a process of shelving or unshelving the server, when a 1 U server is shelved or unshelved, only one group of hook arms 323 may be kept extending out, and other hook arms 323 are extended in, to perform a plug in/out action, and no structural interference occurs. When a 2 U server is shelved or unshelved, the control apparatus 4 may control the tenth drive assembly 324 to drive hook arms 323 adjacent to hook arms 323 that are already in an extending state to extend, so that the two groups of hook arms 323 jointly act, and perform a shelving or an unshelving operation on the 2 U server. In conclusion, the corresponding hook arms 323 may be controlled to extend based on the to-be-plugged device.

Specifically, when the tenth drive assembly 324 is formed, the tenth drive assembly 324 may include a drive motor (not shown in the figure), a rotating shaft 3241, and a reset member (not shown in the figure). The rotating shaft 3241 is connected to the drive motor, and the drive motor can drive the rotating shaft 3241 to rotate. Cams 3242 that are in a one-to-one correspondence with the at least n−1 groups of hook arms 323 are disposed on the rotating shaft 3241, and the cam 3242 includes an arc protruding part. The protruding part of each cam 3242 corresponds to different center angles. For example, the center angles may be increased sequentially. The hook arm 323 has a passive shaft bearing that abuts against the cam 3242. The cam 3242 may drive the passive shaft bearing to move, to drive the hook arm 323 to swing and extend in sequence. The reset members are connected to the at least n−1 groups of hook arms 323 in a one-to-one correspondence, and the reset member is configured to drive the hook arm 323 to reset and retract when a non-protruding part of the cam 3242 abuts against the passive shaft bearing.

Alternatively, in another embodiment, the tenth drive assembly 324 may include drive structures 114 that are in a one-to-one correspondence with the at least n−1 groups of hook arms 323, to separately drive the corresponding hook arms 323 to extend based on a requirement.

A roller 3232 is disposed at an end portion of the hook arm 323. When the plug in/out mechanism 32 hooks the to-be-plugged device, the roller 3232 may abut against the to-be-plugged device, so that the hook arm 323 presses the to-be-plugged device in the second direction Y, and a clamping buckle between the to-be-plugged device and the rack 200 is detached. In this way, the hook 3231 of the hook arm 323 can pull the to-be-plugged device out of the slot of the rack 200. For example, the to-be-plugged device is the server, the server is connected to the rack 200 by using a clamping buckle, and the rack 200 has an abutting pressure towards the server in a direction towards the device assembly system 100. The roller 3232 may abut against the server, to offset the abutting pressure, so as to facilitate unlocking of the clamping buckle between the server and the rack 200. The roller 3232 structure is against the server. This may reduce damage to the server.

In addition, a shutdown component 3233 is further disposed on an end surface of the hook arm 323. The shutdown component 3233 may be specifically a protrusion structure, and can shut down the to-be-plugged device. When the to-be-plugged device to be unshelved is still in an energized state, for example, the to-be-plugged device is the server, and in a scenario in which remote shutdown fails, the control apparatus 4 may control the ninth drive assembly 322 to drive the hook arm 323 to extend in the second direction Y, so that the shutdown component 3233 abuts against a shutdown button of the to-be-plugged device for at least m seconds, to forcibly shut down and power off. Specifically, a specific value of the m seconds may be set based on performance of the to-be-plugged device.

The following describes a specific use process of the device assembly system 100 in this embodiment of this application with reference to a method embodiment of shelving or unshelving an apparatus in a rack.

Figure 17:
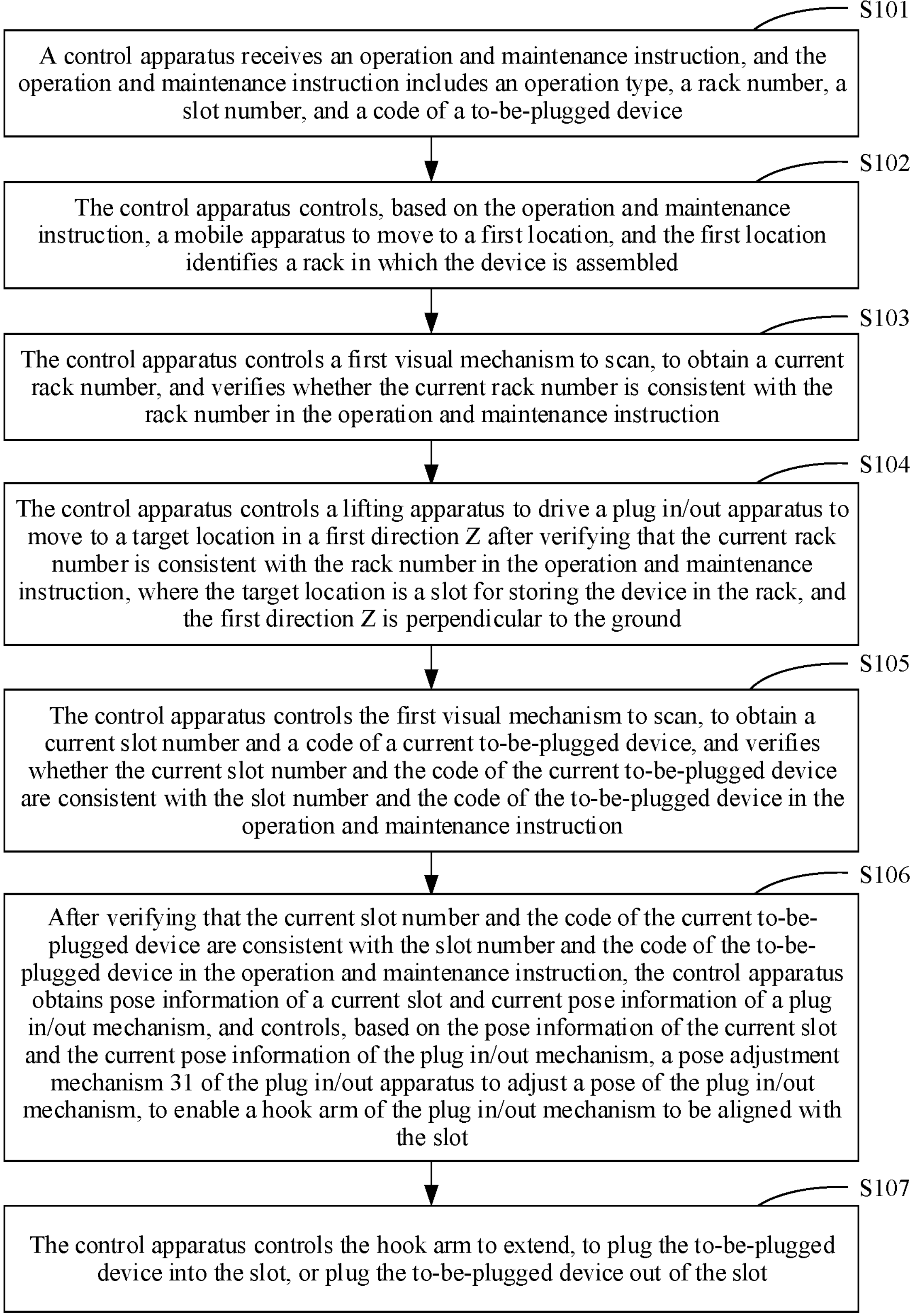
FIG. 17 is a flowchart of a method for shelving or unshelving an apparatus in a rack according to an embodiment of this application.

FIG. 17 is a flowchart of a method for shelving or unshelving an apparatus in a rack according to an embodiment of this application. With reference to FIG. 1 to FIG. 17, the method for shelving or unshelving an apparatus in a rack in this embodiment of this application is implemented by using the device assembly system 100 in the foregoing embodiment, and may specifically include the following steps.

Step S101: The control apparatus 4 receives an operation and maintenance instruction, and the operation and maintenance instruction includes an operation type, a rack number, a slot number, and a code of a to-be-plugged device.

The operation type may specifically include a shelving instruction and an unshelving instruction. The control apparatus first identifies the operation type, and then performs a corresponding shelving operation or unshelving operation.

Step S102: The control apparatus 4 controls, based on the operation and maintenance instruction, the mobile apparatus 1 to move to the first location, and the first location identifies a rack in which a device is assembled.

The mobile apparatus 1 may be the mobile apparatus 1 in any one of the foregoing embodiments, includes the automated guided vehicle 11, and may automatically drive to the first location based on information about a station.

Step S103: The control apparatus 4 controls the first visual mechanism 33 to scan, to obtain a current rack number, and verifies whether the current rack number is consistent with the rack number in the operation and maintenance instruction.

Step S104: The control apparatus 4 controls the lifting apparatus 2 to drive the plug in/out apparatus 3 to move to the target location in the first direction Z after verifying that the current rack number is consistent with the rack number in the operation and maintenance instruction, where the target location is a slot for storing a device in the rack, and the first direction Z is perpendicular to the ground.

The lifting apparatus 2 drives the plug in/out apparatus 3 in the first direction Z, so that the hook arm 323 of the plug in/out apparatus 3 is at or basically at an equal height with the slot on which the shelving or unshelving operation needs to be performed. In a specific embodiment, the control apparatus 4 may obtain, through mapping based on slot information in the operation and maintenance instruction, a location in which the plug in/out apparatus 3 needs to be located in the first direction Z, to control the plug in/out apparatus 3 to move to the specified location.

Step S105: The control apparatus 4 controls the first visual mechanism 33 to scan, to obtain the current slot number and the code of the current to-be-plugged device, and verifies whether the current slot number and the code of the current to-be-plugged device are consistent with the slot number and the code of the to-be-plugged device in the operation and maintenance instruction.

In this solution, the current slot number and the code of the current to-be-plugged device are verified, to ensure operation accuracy and prevent a misoperation. Only when the current slot number matches the slot number in the operation and maintenance instruction, and the code of the current to-be-plugged device matches the code of the to-be-plugged device in the operation and maintenance instruction, the next step of the plug in/out operation is performed. Otherwise, the plug in/out operation is stopped and the alarm signal is generated, for example, an alarm indicator is on or a buzzer sounds, to remind an operator to perform processing.

Step S106: After verifying that the current slot number and the code of the current to-be-plugged device are consistent with the slot number and the code of the to-be-plugged device in the operation and maintenance instruction, the control apparatus 4 obtains the pose information of the current slot and the current pose information of the plug in/out mechanism, and controls, based on the pose information of the current slot and the current pose information of the plug in/out mechanism, the pose adjustment mechanism 31 of the plug in/out apparatus 3 to adjust the pose of the plug in/out mechanism 32, to enable the hook arm 323 of the plug in/out mechanism 32 to be aligned with the slot.

In this solution, feedback information of the first visual mechanism 33 and/or the first sensor 34 is used, so that the control apparatus 4 may control the pose adjustment mechanism 31 to adjust the pose of the plug in/out mechanism 32 in the plurality of dimensions in the three-dimensional coordinate system. In this way, the location of the plug in/out apparatus 3 can be higher, to enable the hook arm 323 to be aligned with the slot. Specifically, precision more precise than millimeter-level alignment precision can be reached, to improve a success rate and reliability of plugging in/plugging out. This does not easily damage the to-be-plugged device or a surrounding structure.

Step S107: The control apparatus 4 controls the hook arm 323 to extend, to plug the to-be-plugged device into the slot, or plug the to-be-plugged device out of the slot.

When the operation type in the operation and maintenance instruction is a shelving task, the plug in/out mechanism 32 of the device assembly system 100 moves the to-be-plugged device to the slot of the rack 200. Specifically, the plug in/out mechanism 32 may have the to-be-plugged device accommodating frame, and the to-be-plugged device is accommodated on the to-be-plugged device accommodating frame. When the hook arm 323 of the plug in/out mechanism 32 is aligned with the slot, the hook arm 323 may drive the to-be-plugged device to plug the to-be-plugged device into the slot, to implement shelving of the to-be-plugged device in the rack 200.

When the operation type in the operation and maintenance instruction is an unshelving task, after the hook arm 323 of the plug in/out mechanism 32 of the device assembly system 100 is aligned with the slot, the control apparatus 4 controls the hook arm 323 to extend, and makes the hook 3231 of the hook arm 323 clamp with the pull hook of the to-be-plugged device, to pull out the to-be-plugged device in the slot, and pull the to-be-plugged device to the to-be-plugged device accommodating frame 321 of the plug in/out mechanism 32. Then, the control apparatus 4 controls the lifting apparatus 2 to drive the plug in/out apparatus 3 to reset in the first direction Z, and the mobile apparatus 1 drives the to-be-plugged device to be transported to a specified location.

After the step S102, the method may further include step S1021. S1021: The control apparatus 4 controls the at least four support legs of the support leg mechanism 12 to extend, and level the mobile apparatus 1. Specifically, the support leg has a one-to-one correspondence with the first drive assembly, and the first drive assembly is connected to the control apparatus 4. The control apparatus 4 may control the length of the part that is of the support leg driven by each first drive assembly and that extends out of the base 111, so that the length of the part that is of the support leg and that extends out of the base 111 may be adjusted, to adapt to the problem that the ground is not flat or the rack 200 is not vertically mounted, so that the device assembly system 100 may be kept parallel to the rack 200. That is, in this application, that the mobile apparatus 1 is leveled means that the device assembly system 100 may be kept parallel to the rack 200, or any state that meets a requirement. This can improve a success rate and reliability of plugging in/plugging out the to-be-plugged device in the device assembly system 100, and improve universality of the device assembly system 100.

After the step S104, the method may further include step S1041. S1041: The control apparatus 4 controls the holding hook 282 of the holding mechanism 28 to be fixedly connected to the rack 200 bearing the to-be-plugged device. In this solution, the device assembly system 100 and the rack 200 can be fastened as an integral structure. An external pushing force generated by the plug in/out action is converted into an internal driving force in the system, so that a probability that the rack 200 and the device assembly system 100 fall down can be reduced, impact of the plug in/out impact force on the device assembly system 100 is reduced. This improves stability and reliability of a working process of the device assembly system 100.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A device assembly system for a data center, the system comprising:

a control apparatus, a mobile apparatus, a lifting apparatus, and a plug in/out apparatus, wherein the control apparatus is configured to control, based on an operation and maintenance instruction, the mobile apparatus, the lifting apparatus, and the plug in/out apparatus to complete an operation of the operation and maintenance instruction, and wherein the operation and maintenance instruction instructs the system to complete an operation of assembly of a device;

wherein the mobile apparatus is configured to move the system to a first location of a rack on a floor in which the device is assembled;

wherein the lifting apparatus is configured to move, in a first direction perpendicular to the floor, the plug in/out apparatus to a target location for storing the device in the rack, wherein the plug in/out apparatus is configured to insert the device at the target location, or withdraw the device from the target location, wherein the lifting apparatus comprises a holding mechanism that is configured to connect the rack at the first location and the device assembly system, wherein the holding mechanism comprises a fourth drive assembly and a holding hook, and wherein the fourth drive assembly linearly drives the holding hook, as a whole, to affect a fixed connection to the rack.

2. The device assembly system according to claim 1, wherein the mobile apparatus comprises an anti-collision strip and a navigation component, the anti-collision strip is circumferentially arranged and connected to the navigation component, and in response to detecting that the anti-collision strip collides with an obstacle, the navigation component controls, based on a signal of the anti-collision strip, the mobile apparatus to change a direction or stop moving.

3. The device assembly system according to claim 1, wherein:

the mobile apparatus comprises a navigation device;

the lifting apparatus is fastened to the mobile apparatus, and is connected to a plug in/out apparatus mounting frame, and the lifting apparatus drives the plug in/out apparatus mounting frame to move in the first direction;

the plug in/out apparatus is mounted on the plug in/out apparatus mounting frame, and comprises a pose adjustment mechanism, a plug in/out mechanism, a first visual mechanism, and a first sensor, the first visual mechanism and/or the first sensor obtain pose information of a current slot, and the first visual mechanism obtains a current slot number and a code of a current to-be-plugged device; and the pose adjustment mechanism is connected to the plug in/out mechanism, and drives the plug in/out mechanism to adjust a pose, so that the plug in/out mechanism is aligned with the target location in the rack, and the target location is the current slot; and the control apparatus is separately connected to the mobile apparatus, the lifting apparatus, and the plug in/out apparatus, and is configured to: control the mobile apparatus to move to the first location; control the lifting apparatus to drive the plug in/out apparatus to move to the target location in the first direction; and based on the pose information of the current slot and actual pose information of the plug in/out mechanism, control the pose adjustment mechanism to adjust the pose of the plug in/out mechanism, and control the plug in/out mechanism to plug the to-be-plugged device into the current slot, or control the plug in/out mechanism to unplug the to-be-plugged device out of the current slot.

4. The device assembly system according to claim 3, wherein the pose adjustment mechanism comprises a first portion, a second portion, a third portion, a fourth portion, and a fifth portion that are disposed in sequence, the first portion is fastened to the plug in/out apparatus mounting frame, a fifth drive assembly is connected between the first portion and the second portion, and the fifth drive assembly drives the second portion to rotate relative to the first portion by using the first direction as an axis; a sixth drive assembly is connected between the second portion and the third portion, and the sixth drive assembly drives the third portion to move relative to the second portion in a second direction; one end of the third portion is hinged to one end of the fourth portion, a hinged shaft of the third portion and the fourth portion extends in the second direction, the other end of the third portion and the other end of the fourth portion are connected to a seventh drive assembly, and the seventh drive assembly drives the fourth portion to swing relative to the third portion; an eighth drive assembly is connected between the fifth portion and the fourth portion, and the eighth drive assembly drives the fifth portion to move in a third direction relative to the fourth portion; and the fifth drive assembly, the sixth drive assembly, the seventh drive assembly, and the eighth drive assembly are separately connected to the control apparatus, and the first direction, the second direction, and the third direction are perpendicular to each other.

5. The device assembly system according to claim 1, wherein the lifting apparatus comprises a second drive assembly, a first gantry, a second gantry, and a third gantry, the first gantry is fastened to the mobile apparatus, and a plug in/out apparatus mounting frame is mounted on the third gantry; and wherein the first gantry is connected to the second gantry through a straight-line transmission member, and the second drive assembly is connected to the straight-line transmission member, to drive the second gantry to move in the first direction relative to the first gantry; and the first gantry is connected to the third gantry through a rope mechanism, the rope mechanism comprises a chain and a pulley, two ends of the chain are respectively connected to the third gantry and the first gantry, the pulley is mounted on the second gantry, and the second gantry is located between the first gantry and the third gantry.

6. The device assembly system according to claim 5, wherein a third drive assembly is disposed between the plug in/out apparatus mounting frame and the third gantry, and the third drive assembly drives the plug in/out apparatus mounting frame to move in the first direction relative to the third gantry.

7. The device assembly system according to claim 1, wherein the mobile apparatus further comprises a support leg mechanism, configured to support the device assembly system at the first location; and the support leg mechanism comprises a first drive assembly and a support leg, the first drive assembly is connected to the support leg, and drives the support leg to extend and retract in the first direction, and the support leg can extend towards the ground, to support the device assembly system.

8. The device assembly system according to claim 7, wherein the support leg structure is further configured to adjust a vertical angle of the device assembly system in the first direction; and the support leg mechanism comprises at least four support legs and four first drive assemblies connected to the support legs in a one-to-one correspondence, the at least four support legs form a surface support of the mobile apparatus, and each first drive assembly of the four first drive assemblies is connected to the control apparatus.

9. The device assembly system according to claim 8, wherein an end portion of the holding mechanism comprises a first wall surface, a position sensor is disposed on the first wall surface, the control apparatus is separately connected to the position sensor and the fourth drive assembly, and the control apparatus is configured to control, based on a signal of the position sensor, the fourth drive assembly to drive the holding hook to be fixedly connected to the rack.

10. The device assembly system according to claim 1, wherein the plug in/out mechanism comprises a to-be-plugged device accommodating frame, a ninth drive assembly, and at least one group of hook arms; the to-be-plugged device accommodating frame is configured to accommodate a to-be-plugged device; each group of hook arms comprises two hook arms disposed opposite to each other in a third direction, the two hook arms of each group of hook arms are located at two ends of the to-be-plugged device accommodating frame, and each hook arm has a hook adapted to the to-be-plugged device; the ninth drive assembly is connected to the control apparatus, and the control apparatus controls the ninth drive assembly to drive the hook arm to extend and retract in a second direction, to plug the to-be-plugged device located on the to-be-plugged device accommodating frame into the target location, or plug out the to-be-plugged device located at the target location to the to-be-plugged device accommodating frame; and the first direction, the second direction, and the third direction are perpendicular to each other.

11. The device assembly system according to claim 10, wherein the plug in/out mechanism comprises n groups of hook arms, wherein $n \geq 2$, the n groups of hook arms are arranged in the first direction, at least $n-1$ groups of hook arms are connected to a tenth drive assembly, and the tenth drive assembly drives at least one group of hook arms in the at least $n-1$ groups of hook arms to extend and retract, to adapt to to-be-plugged devices with different thicknesses in the first direction.

12. The device assembly system according to claim 11, wherein the tenth drive assembly comprises a drive motor, a rotating shaft connected to the drive motor, and reset members connected to the at least $n-1$ groups of hook arms in a one-to-one correspondence, cams that are in a one-to-one correspondence with the at least $n-1$ groups of hook arms are disposed on the rotating shaft, the cam drives the hook arm to extend, and the reset member drives the hook arm to retract.

13. The device assembly system according to claim 10, wherein a roller is disposed at an end portion of the hook arm, and the roller is configured to abut against the to-be-plugged device.

14. The device assembly system according to claim 10, wherein a shutdown component is disposed on an end surface of the hook arm, and in response to the hook arm hooking the to-be-plugged device, the shutdown component is configured to shut down the to-be-plugged device.

15. A device assembly method, comprising:

receiving, by a control apparatus, an operation and maintenance instruction, wherein the operation and maintenance instruction comprises an operation type, a rack number, a slot number, and a code of a to-be-plugged device;

controlling, by the control apparatus based on the operation and maintenance instruction, a mobile apparatus to move to a first location, wherein the first location identifies a rack in which the device is assembled;

controlling, by the control apparatus, a first visual mechanism to scan, to obtain a current rack number, and verify whether the current rack number is consistent with the rack number in the operation and maintenance instruction;

controlling, by the control apparatus, the lifting apparatus to drive a plug in/out apparatus to move to a target location in a first direction after verifying that the current rack number is consistent with the rack number in the operation and maintenance instruction, wherein the target location is a slot for storing the device in the rack, and the first direction is perpendicular to the ground;

controlling, by the control apparatus, the first visual mechanism to scan, to obtain a current slot number and a code of a current to-be-plugged device, and verify whether the current slot number and the code of the current to-be-plugged device are consistent with the slot number and the code of the to-be-plugged device in the operation and maintenance instruction;

after verifying that the current slot number and the code of the current to-be-plugged device are consistent with the slot number and the code of the to-be-plugged device in the operation and maintenance instruction, obtaining, by the control apparatus, pose information of a current slot and current pose information of a plug in/out mechanism, and controlling, based on the pose information of the current slot and the current pose information of the plug in/out mechanism, a pose adjustment mechanism of the plug in/out apparatus to adjust a pose of the plug in/out mechanism, to enable a hook arm of the plug in/out mechanism to be aligned with the slot; and controlling, by the control apparatus, the hook arm to extend, to plug the to-be-plugged device into the slot, or unplug the to-be-plugged device out of the slot.

16. The device assembly method according to claim 15, wherein after the controlling, by the control apparatus based on the operation and maintenance instruction, a mobile apparatus to move to a first location, wherein the first location identifies a rack in which the device is assembled, the method comprises:

controlling, by the control apparatus, at least four support legs of the support leg mechanism to extend and level the mobile apparatus.

17. The device assembly method according to claim 15, wherein after the controlling, by the control apparatus, the lifting apparatus to drive a plug in/out apparatus to move to the target location in the first direction, the method further comprises:

controlling, by the control apparatus, a holding hook of a holding mechanism to be fixedly connected to the rack bearing the to-be-plugged device.

* * * * *